US012604592B2

(12) United States Patent
Kim et al.

(10) Patent No.:     US 12,604,592 B2
(45) Date of Patent:      Apr. 14, 2026

(54) DISPLAY DEVICE AND METHOD OF FABRICATING THE SAME

(71) Applicant: Samsung Display Co., LTD., Yongin-si (KR)

(72) Inventors: Jae Hee Kim, Yongin-si (KR); Ki Nyeng Kang, Yongin-si (KR); In Pyo Kim, Yongin-si (KR); Jeong Kook Wang, Yongin-si (KR); Hyo Jeong Lee, Yongin-si (KR); Jong Hwan Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 531 days.

(21) Appl. No.: 18/076,241

(22) Filed: Dec. 6, 2022

(65) Prior Publication Data

US 2023/0187472 A1      Jun. 15, 2023

(30) Foreign Application Priority Data

Dec. 10, 2021     (KR) ......................... 10-2021-0176984

(51) Int. Cl.
| | |
|---|---|
| *H10H 29/14* | (2025.01) |
| *H10H 20/821* | (2025.01) |
| *H10H 20/831* | (2025.01) |
| *H10H 20/84* | (2025.01) |
| *H10H 20/851* | (2025.01) |
| *H10H 20/01* | (2025.01) |

(52) U.S. Cl.
CPC ........ *H10H 29/142* (2025.01); *H10H 20/821* (2025.01); *H10H 20/831* (2025.01); *H10H 20/84* (2025.01); *H10H 20/851* (2025.01); *H10H 20/032* (2025.01); *H10H 20/034* (2025.01)

(58) Field of Classification Search
CPC .......................... H10H 29/142; H01L 25/0753
See application file for complete search history.

(56) References Cited

U.S. PATENT DOCUMENTS

| | | | |
|---|---|---|---|
| 2006/0091417 A1 | 5/2006 | Sugimoto et al. | |
| 2018/0122788 A1* | 5/2018 | Wu | H01L 25/167 |
| 2021/0367104 A1* | 11/2021 | Yun | H01L 25/167 |

FOREIGN PATENT DOCUMENTS

CN          114300417 A  *  4/2022

* cited by examiner

*Primary Examiner* — Monica D Harrison
*Assistant Examiner* — Jacob T Nelson
(74) *Attorney, Agent, or Firm* — Womble Bond Dickinson (US) LLP

(57)          ABSTRACT

A display device may include a first electrode and a second electrode spaced from each other on a substrate. A light emitting element may be on the first electrode and the second electrode. A first insulating pattern may be on the light emitting element. A first contact electrode may be on a first side of the first insulating pattern and contacting a first end of the light emitting element. A second insulating pattern may be on the first insulating pattern and partially covering the first contact electrode. A third insulating layer may be on the second insulating pattern. A second contact electrode may be on a second side of the first insulating pattern, and contact a second end of the light emitting element that is exposed from the first insulating pattern, the second insulating pattern, and the third insulating layer.

20 Claims, 23 Drawing Sheets

DISPLAY DEVICE AND METHOD OF FABRICATING THE SAME

CROSS-REFERENCE TO RELATED APPLICATION

This application claims priority to and the benefit of Korean patent application number 10-2021-0176984 filed on Dec. 10, 2021, the entire disclosure of which is incorporated by reference herein.

BACKGROUND

1. Field

Various embodiments of the present disclosure relate to a display device and a method of fabricating the display device.

2. Description of Related Art

With an increase in interest in an information display and an increase in demand to use portable information media, demand for display devices is markedly increased, and commercialization thereof is in progress.

SUMMARY

Various embodiments of the present disclosure are directed to a display device capable of improving contact of a light emitting element, and a method of fabricating the display device.

A display device in accordance with one or more embodiments of the present disclosure may include: a first electrode and a second electrode spaced from each other on a substrate; a light emitting element on the first electrode and the second electrode; a first insulating pattern on the light emitting element; a first contact electrode adjacent to a first side of the first insulating pattern and contacting a first end of the light emitting element; a second insulating pattern on the first insulating pattern and partially covering the first contact electrode; a third insulating layer on the second insulating pattern; and a second contact electrode adjacent to a second side of the first insulating pattern, and contacting a second end of the light emitting element that is exposed from the first insulating pattern, the second insulating pattern, and the third insulating layer.

A stepped portion may be formed in a portion of the first contact electrode that is covered with the second insulating pattern.

A thickness of the portion of the first contact electrode may be less than an average thickness of the first contact electrode.

The average thickness of the first contact electrode may be greater than an average thickness of the second contact electrode.

The first insulating pattern and the second insulating pattern may include an identical material or similar materials.

The second insulating pattern may be on the light emitting element at a position closer to the first electrode than to the second electrode.

The first electrode and the second electrode may be spaced from each other in a first direction. A distance between the first contact electrode and the second contact electrode in the first direction may be equal to or less than one third of a distance between the first electrode and the second electrode in the first direction.

The distance between the first contact electrode and the second contact electrode may be approximately 1 μm.

A width of the second insulating pattern with respect to the first direction may be approximately 2 μm.

The second contact electrode may partially cover the third insulating layer.

The first contact electrode may partially cover the first insulating pattern.

The first contact electrode may include: a first part located between the first insulating pattern and the second insulating pattern; and a second part located between the second insulating pattern and the third insulating layer.

An average thickness of the first contact electrode may be substantially identical with an average thickness of the second contact electrode.

The display device may further include color conversion particles on the light emitting element, and configured to convert a light having a first color emitted from the light emitting element to light having a second color.

A display device in accordance with one or more embodiments of the present disclosure may include: a first electrode and a second electrode spaced from each other on a substrate; a light emitting element on the first electrode and the second electrode; an insulating pattern on the light emitting element; a first contact electrode adjacent to a first side of the insulating pattern and contacting a first end of the light emitting element; and a second contact electrode adjacent to a second side of the insulating pattern and contacting a second end of the light emitting element. A stepped portion may be formed in a portion of the first contact electrode that overlaps the insulating pattern in a thickness direction of the substrate.

A thickness of the portion of the first contact electrode may be less than an average thickness of the first contact electrode.

The portion of the first contact electrode may be located between the insulating pattern and the light emitting element.

The insulating pattern may be on the light emitting element at a position closer to the first electrode than to the second electrode.

A method of fabricating a display device in accordance with one or more embodiments of the present disclosure may include: preparing a panel including a first electrode and a second electrode spaced from each other on a substrate, and a light emitting element on the first electrode and the second electrode; forming a first insulating pattern on the light emitting element, the first insulating pattern exposing a first end of the light emitting element, and cover a second end of the light emitting element; forming a first contact electrode on the first end of the light emitting element and the first electrode; forming a second insulating pattern on the first insulating pattern and a portion of the first contact electrode; exposing the second end of the light emitting element by forming a third insulating layer that covers the second insulating pattern and the first contact electrode and by partially etching the first insulating pattern, the second insulating pattern, and the third insulating layer; and forming a second contact electrode on the second end of the light emitting element and the second electrode.

The method may further include forming the first contact electrode on the first end of the light emitting element and the first electrode after forming the second insulating pattern. A stepped portion may be formed in a portion of the first contact electrode that is covered with the second insulating pattern.

A display device in accordance with one or more embodiments of the present disclosure may include a first insulating pattern and a second insulating pattern. First and second contact electrodes may be spaced from each other by a first insulating pattern. As the width of the first insulating pattern is reduced, a surface area with which the first and second contact electrodes contact a light emitting element may be increased, and a contact defect between the light emitting element and the first and second contact electrodes resulting from a process error may be prevented or mitigated.

Furthermore, because the second insulating pattern covers a portion of the first contact electrode and the first insulating pattern, a short circuit between the first contact electrode and the second contact electrode (e.g., a short circuit caused by a residue of the first contact electrode that is present on the first insulating pattern) may be prevented from being caused.

In a method of fabricating the display device in accordance with one or more embodiments of the present disclosure, the first contact electrode may be formed through total two processes (i.e., a double deposition process) before and after the second insulating pattern is formed. Consequently, contact between the light emitting element and the first contact electrode may be improved.

The effects, aspects, and features of the present disclosure are not limited by the foregoing, and other various effects, aspects, and features are anticipated herein.

BRIEF DESCRIPTION OF THE DRAWINGS

FIG. 8 is a sectional view taken along the line I-I' of FIG. 7.

FIGS. 17 and 18 are sectional views each illustrating an embodiment of a pixel unit included in the display device of FIG. 3.

DETAILED DESCRIPTION

Figure 1:
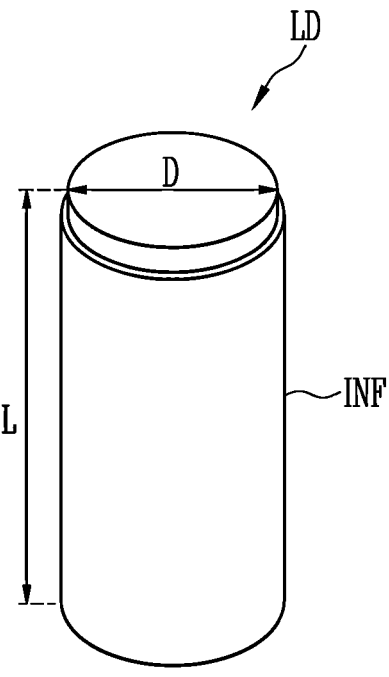
FIGS. 1 and 2 are a perspective view and a sectional view illustrating a light emitting element in accordance with one or more embodiments of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

Aspects and features of embodiments of the present disclosure, and methods for achieving the same will be cleared with reference to embodiments described later in detail together with the accompanying drawings. However, it is to be noted that the present disclosure is not limited to the embodiments but can be embodied in various other ways. In this specification, "connected/coupled" refers to one component not only directly coupling another component but also indirectly coupling another component through an intermediate component.

Hereinafter, a display device in accordance with an embodiment of the present disclosure will be described with reference to the attached drawings.

Figure 2:
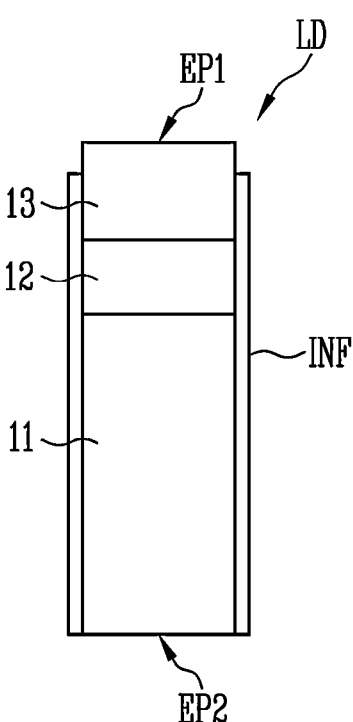

FIGS. 1 and 2 are a perspective view and a sectional view illustrating a light emitting element in accordance with one or more embodiments of the present disclosure. Although FIGS. 1 and 2 illustrate a column-type light emitting element LD, the type and/or shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, if a direction in which the light emitting element LD extends refers to a longitudinal direction (L), the light emitting element LD may include the first semiconductor layer 11, the active layer 12, and the second semiconductor layer 13 that are successively stacked in the longitudinal direction (L).

The light emitting element LD may be provided in the form of a column extending in one direction. The light emitting element LD may include a first end EP1 and a second end EP2. One of the first and second semiconductor layers 11 and 13 may be disposed on the first end EP1 of the light emitting element LD. The other one of the first and second semiconductor layers 11 and 13 may be disposed on the second end EP2 of the light emitting element LD.

In one or more embodiments, the light emitting element LD may be a light emitting element fabricated in a column shape through an etching scheme or the like. In this specification, the term "column-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, the length L of the light emitting element LD may be greater than a diameter D thereof (or a width of the cross-section thereof).

The light emitting element LD may have a small size corresponding to a range from the nanometer scale to the micrometer scale. For example, the light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include an n-type semiconductor layer. For instance, the first semiconductor layer 11 may include an n-type semiconductor layer that includes any one semiconductor material of InAlGaN, GaN, AlGaN, InGaN, AlN, and InN and is doped with a first conductive dopant such as Si, Ge, or Sn. However, the material for forming the first semiconductor layer 11 is not limited thereto, and the first semiconductor layer 11 may be formed of various other materials.

The active layer 12 may be disposed on the first semiconductor layer 11 and have a single-quantum well structure or a multi-quantum well structure. The location of the active layer 12 may be changed in various ways depending on the type of the light emitting element LD.

A cladding layer doped with a conductive dopant may be formed on and/or under the active layer 12. For example, the cladding layer may be formed of AlGaN or InAlGaN. In one or more embodiments, a material such as AlGaN or InAlGaN may be used to form the active layer 12, and various other materials may be used to form the active layer 12.

The second semiconductor layer 13 may be disposed on the active layer 12 and include a semiconductor layer having a type different from that of the first semiconductor layer 11. For example, the second semiconductor layer 13 may include a p-type semiconductor layer. For instance, the second semiconductor layer 13 may include a p-type semiconductor layer that includes any one semiconductor material of InAlGaN, GaN, AlGaN, InGaN, AlN, and InN, and is doped with a second conductive dopant such as Mg. However, the material for forming the second semiconductor layer 13 is not limited thereto, and various other materials may be used to form the second semiconductor layer 13.

If a voltage equal to or greater than a threshold voltage is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source of various light emitting devices as well as a pixel of the display device.

The light emitting element LD may further include an insulating film INF provided on a surface of the light emitting element LD. The insulating film INF may be formed on the surface of the light emitting element LD to enclose an outer surface (e.g., an outer peripheral or circumferential surface) of at least the active layer 12, and may further enclose one area of each of the first and second semiconductor layers 11 and 13.

In one or more embodiments, the insulating film INF may allow the opposite ends of the light emitting element LD that have different polarities to be exposed to the outside. For example, the insulating film INF may allow one end of each of the first and second semiconductor layers 11 and 13 disposed on the first and second ends EP1 and EP2 of the light emitting element LD to be exposed. In one or more embodiments, the insulating film INF may allow a side portion of each of the first and second semiconductor layers 11 and 13 adjacent to the first and second ends EP1 and EP2 of the light emitting element LD having different polarities to be exposed.

In one or more embodiments, the insulating film INF may have a single-layer structure or a multi-layer structure (e.g., a double-layer structure formed of aluminum oxide ($AlO_x$) and silicon oxide ($SiO_x$)) including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited thereto. In one or more embodiments, the insulating layer INF may be omitted.

In case that the insulating film INF is provided to cover the surface of the light emitting element LD, for example, an outer surface (e.g., an outer peripheral or circumferential surface) of the active layer 12, the active layer 12 may be prevented from short-circuiting with a first pixel electrode or a second pixel electrode to be described below. Consequently, the electrical stability of the light emitting element LD may be secured.

If the insulating film INF is provided on the surface of the light emitting element LD, occurrence of a defect on the surface of the light emitting element LD may be reduced or minimized, whereby the lifetime and efficiency of the light emitting element LD may be improved. In addition, even in the case where a plurality of light emitting elements LD are disposed adjacent to each other, an undesired short-circuit may be prevented from occurring between the light emitting elements LD.

In one or more embodiments, the light emitting element LD may further include an additional component as well as the first semiconductor layer 11, the active layer 12, the second semiconductor layer 13, and/or the insulating film INF that encloses the first semiconductor layer 11, the active layer 12, the second semiconductor layer 13. For example, the light emitting element LD may further include at least one fluorescent layer, at least one active layer, at least one semiconductor layer and/or at least one electrode layer disposed on one end of the first semiconductor layer 11, the active layer 12, and/or the second semiconductor layer 13. For example, a contact electrode layer may be disposed on each of the first and second ends EP1 and EP2 of the light emitting element LD. Although FIGS. 1 and 2 illustrate a column-type light emitting element LD, the type, the structure, and/or the shape of the light emitting element LD may be changed in various ways. For example, the light emitting element LD may be formed of a core-shell structure having a polypyramid shape.

A light emitting device including the light emitting element LD described above may be used not only in a display device but also in various devices which requires a light source. For instance, a plurality of light emitting elements LD may be disposed in each pixel of a display panel, so that the light emitting elements LD may be used as a light source of the pixel. However, the application field of the light emitting element LD is not limited to the foregoing examples. For example, the light emitting element LD may also be used in other types of devices such as a lighting device, which requires a light source.

Figure 3:
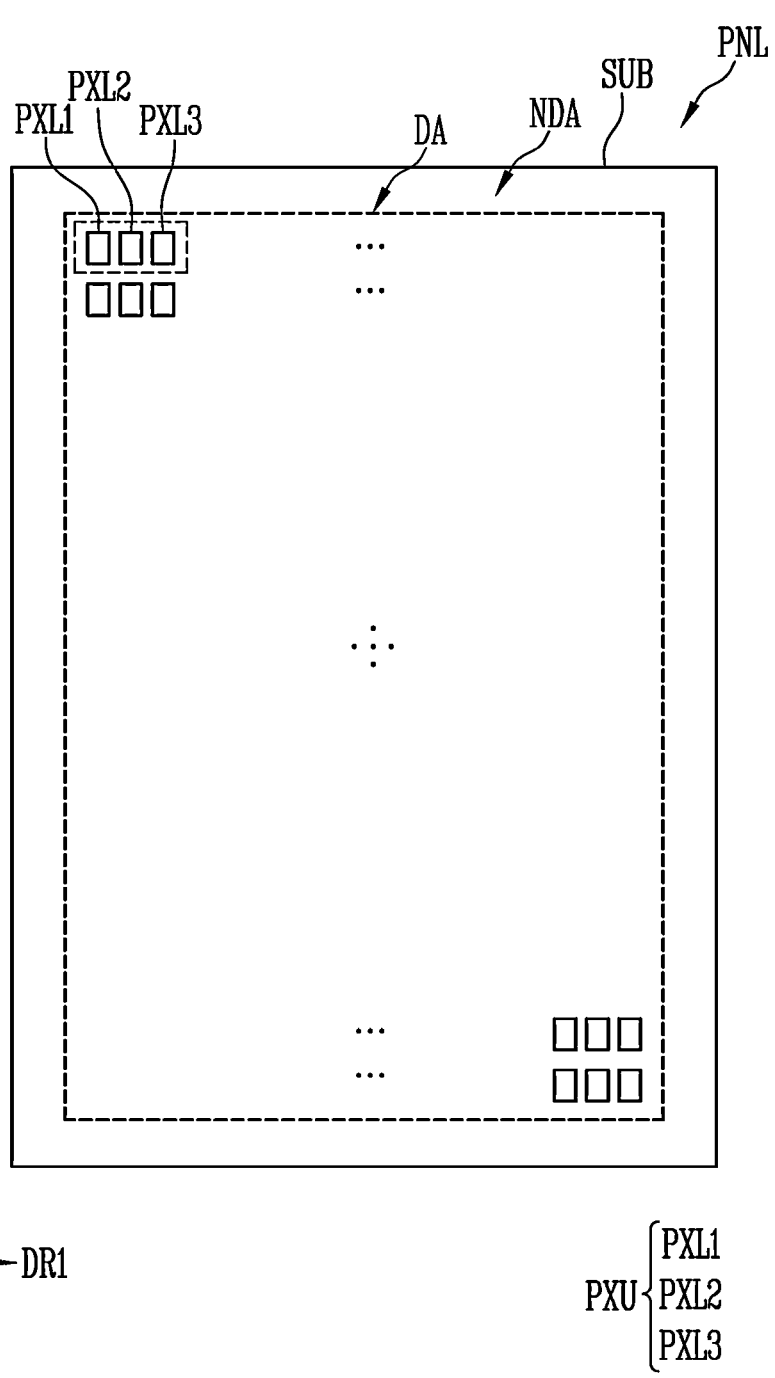
FIG. 3 is a plan view illustrating a display device in accordance with one or more embodiments of the present disclosure.

FIG. 3 is a plan view illustrating a display device in accordance with one or more embodiments of the present disclosure. FIG. 3 illustrates a display device, for example, a display panel PNL provided in the display device, as an example of an electronic device which may use, as a light source, the light emitting element LD described in the embodiments of FIGS. 1 and 2.

Each pixel unit PXU of the display panel PNL and each pixel for forming the pixel unit PXU may include at least one light emitting element LD. For the sake of explanation, FIG. 3 simply illustrates the structure of the display panel PNL in accordance with one or more embodiments, focused on a display area DA. In one or more embodiments, at least one driving circuit (e.g., at least one of a scan driver and a data driver), lines, and/or pads may be further provided on the display panel PNL.

Referring to FIG. 3, the display panel PNL may include a substrate SUB, and a pixel unit PXU disposed on the substrate SUB. The pixel unit PXU may include first pixels PXL1, second pixels PXL2, and/or third pixels PXL3. In the following embodiments, the term "pixel PXL (refer to FIG. 4)" or "pixels PXL" will be used to arbitrarily designate at least one pixel among the first pixels PXL1, the second pixels PXL2, and the third pixels PXL3, or collectively designate two or more kinds of pixels thereamong.

The substrate SUB may form a base of the display panel PNL and may be a rigid or flexible substrate or film. For example, the substrate SUB may be a rigid substrate made of glass or reinforced glass, a flexible substrate (or a thin film) formed of plastic or metal, or at least one insulating layer. The material and/or properties of the substrate SUB is not particularly limited.

In one or more embodiments, the substrate SUB may be substantially transparent. Here, the words "substantially transparent" may mean that light can pass through the substrate SUB at a suitable transmissivity (e.g., a set or predetermined transmissivity) or more. In one or more embodiments, the substrate SUB may be translucent or opaque. Furthermore, the substrate SUB may include reflective material in one or more embodiments.

The display panel PNL and the substrate SUB for forming the display panel PNL may include a display area DA for displaying an image, and a non-display area NDA formed in an area (e.g., a set or a predetermined area) other than the display area DA. The non-display area NDA may be around the display area along the edge or periphery of the display area DA.

The pixels PXL may be disposed in the display area DA. Various lines, pads, and/or internal circuits that are connected to the pixels PXL of the display area DA may be disposed in the non-display area NDA. The pixels PXL may be regularly arranged according to a stripe or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. The arrangement structure of the pixels PXL is not limited thereto, and the pixels PXL may be arranged in the display area DA in various structures and/or schemes.

In one or more embodiments, two or more kinds of pixels PXL that emit different colors of light may be disposed in the display area DA. For example, first pixels PXL1 configured to emit a first color of light, second pixels PXL2 configured to emit a second color of light, and a third pixels PXL3 configured to emit a third color of light may be arranged in the display area DA. For example, the first to third pixels PXL1, PXL2, and PXL3 may be sequentially repeatedly disposed along a first direction DR1, and also may be repeatedly disposed along a second direction DR2. At least one first pixel PXL1, at least one second pixel PXL2, and at least one third pixel PXL3 that are disposed adjacent to each other may form one pixel unit PXU that may emit light having various colors. For example, each of the first to third pixels PXL1, PXL2, and PXL3 may be a pixel configured to emit a desired color of light (e.g. a set or predetermined color of light). In one or more embodiments, the first pixel PXL1 may be a red pixel that emits red light, a second pixel PXL2 may be a green pixel that emits green light, and a third pixel PXL3 may be a blue pixel that emits blue light. However, the present disclosure is not limited thereto.

In one or more embodiments, the first pixel PXL1, the second pixel PXL2, and the third pixel PXL3 may respectively include, as light sources, a light emitting element related to the first color, a light emitting element related to the second color, and a light emitting element related to the third color, so that the pixels may respectively emit the first color of light, the second color of light, and the third color of light. In one or more embodiments, the first pixel PXL1, the second pixel PXL2, and the third pixel PXL3 may respectively include light emitting elements configured to emit the same color of light, and color filters and color conversion layers having different colors may be disposed on the respective light emitting elements so that the first, second, and third pixels PXL1, PXL2, and PXL3 may respectively emit the first color of light, the second color of light, and the third color of light. However, the colors, the types, and/or the number of pixels PXL that form each pixel unit PXU are not particularly limited. In other words, the color of light to be emitted from each pixel PXL may be changed in various ways.

The pixel PXL may include at least one light source that is driven by a control signal (e.g., a scan signal and a data signal) and/or a power supply (e.g., a first power supply and a second power supply). In one or more embodiments, the light source may include at least one light emitting element LD in accordance with any one of the embodiments of FIGS. 1 and 2, e.g., subminiature column-type light emitting elements LD having a small size corresponding to a range from the nanometer scale to the micrometer scale. However, the present disclosure is not limited thereto, and different types of light emitting elements LD may be used as a light source of the pixel PXL.

In one or more embodiments, each pixel PXL may be formed of an active pixel. However, the types, structures, and/or driving schemes of the pixels PXL applicable to the display device are not particularly limited. For example, each pixel PXL may be formed of a pixel for passive or active light emitting display devices that have various structures and/or may be operated in various driving schemes.

Figure 4:
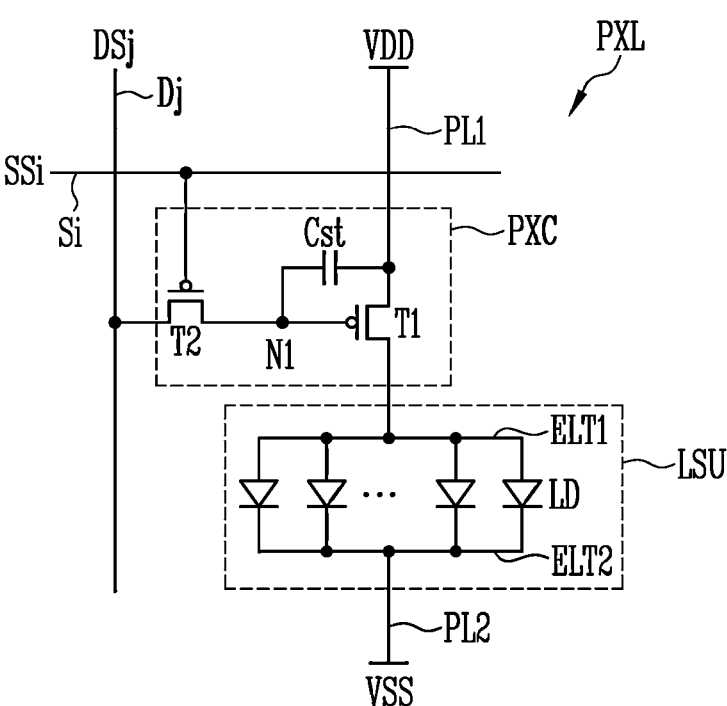
FIGS. 4 to 6 are circuit diagrams each illustrating an embodiment of a pixel included in the display device of FIG. 3.
Figure 5:
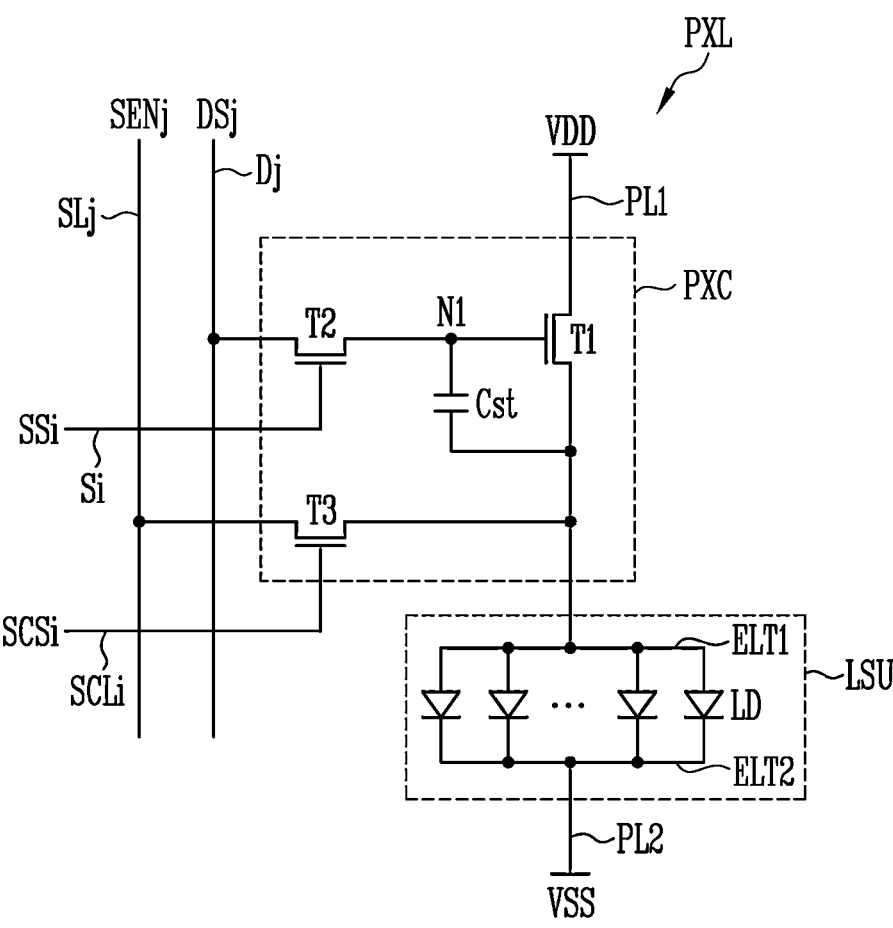
Figure 6:
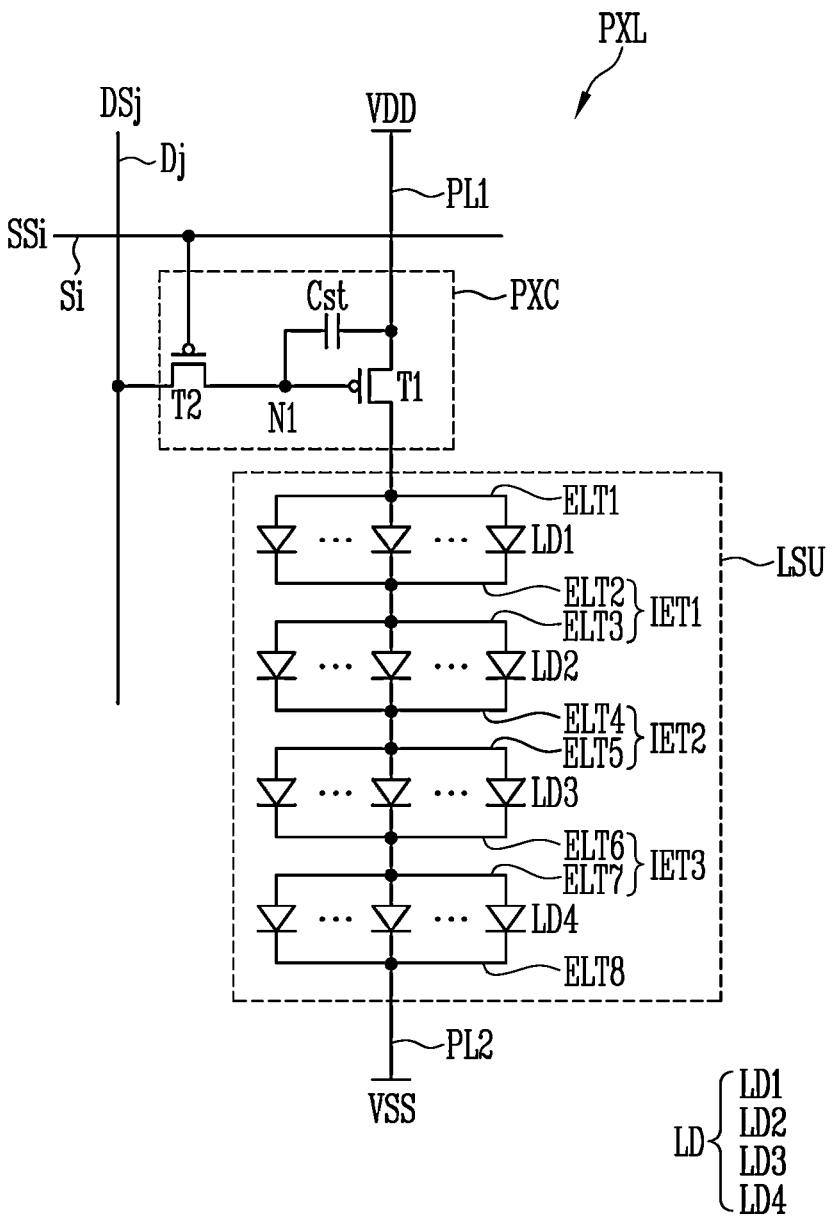

FIGS. 4 to 6 are circuit diagrams each illustrating an embodiment of a pixel included in the display device of FIG. 3. For example, FIGS. 4 to 6 illustrate an embodiment of the pixel PXL that can be applied to an active display device. However, the types of the pixel PXL and the display device are not limited thereto.

In one or more embodiments, the pixel PXL illustrated in FIGS. 4 to 6 may be any one of the first pixel PXL1, the second pixel PXL2, and the third pixel PXL3 that are provided on the display panel PNL of FIG. 3. The first pixel PXL1, the second pixel PXL2, and the third pixel PXL3 may have a substantially identical or similar structure.

Referring to FIG. 4, the pixel PXL may include a light source unit LSU configured to generate light having a luminance corresponding to a data signal, and a pixel circuit PXC configured to drive the light source unit LSU.

The light source unit LSU may include at least one light emitting element LD connected between the first power supply VDD and the second power supply VSS. For example, the light source unit LSU may include a first electrode ELT1 (referred also to as "first pixel electrode" or "first alignment electrode") connected to the first power supply VDD via the pixel circuit PXC and a first power line PL1, a second electrode ELT2 (referred also to as "second pixel electrode" or "second alignment electrode") connected to the second power supply VSS through a second power line PL2, and a plurality of light emitting elements LD connected in the same direction between the first and second electrodes ELT1 and ELT2. In one or more embodiments, the first electrode ELT1 may be an anode electrode, and the second electrode ELT2 may be a cathode electrode.

Each of the light emitting elements LD may include a first end (e.g., a p-type end) electrically connected to the first power supply VDD by the first electrode ELT1 and/or the pixel circuit PXC, and a second end (e.g., an n-type end) electrically connected to the second power supply VSS by the second electrode ELT2. In other words, the light emitting elements LD may be connected in parallel between the first and second electrodes ELT1 and ELT2 in a forward direction. Each of the light emitting elements LD connected in the forward direction between the first power supply VDD and the second power supply VSS may form a valid light source. Such valid light sources may form the light source unit LSU of the pixel PXL.

The first power supply VDD and the second power supply VSS may have different potentials to allow the light emitting elements LD to emit light. For example, the first power supply VDD may be set as a high-potential power supply, and the second power supply VSS may be set as a low-potential power supply. Here, a difference in potential between the first power supply VDD and the second power supply VSS may be set to a threshold voltage of the light emitting elements LD or more during at least an emission period of the pixel PXL.

The first ends (e.g., p-type ends) of the light emitting elements LD that form each light source unit LSU may be connected in common to the pixel circuit PXC by one electrode of the light source unit LSU (e.g., the first electrode ELT1 of each pixel PXL), and may be electrically connected to the first power supply VDD by the pixel circuit PXC and the first power line PL1. The second ends (e.g., n-type ends) of the light emitting elements LD may be connected in common to the second power supply VSS by the second power line PL2 and the other electrode of the light source unit LSU (e.g., the second electrode ELT2 of each pixel PXL).

The light emitting elements LD may emit light having a luminance corresponding to driving current supplied thereto through the corresponding pixel circuit PXC. For example, during each frame period, the pixel circuit PXC may supply driving current corresponding to a gray scale value to be expressed in the corresponding frame to the light source unit LSU. The driving current supplied to the light source unit LSU may be divided into parts that flow to the light emitting elements LD connected in the forward direction. Hence, each of the light emitting elements LD may emit light having a luminance corresponding to current applied thereto, so that the light source unit LSU may emit light having a luminance corresponding to the driving current.

The pixel circuit PXC may be electrically connected between the first power supply VDD and the first electrode ELT1. The pixel circuit PXC may be electrically connected to a scan line Si and a data line Dj of the corresponding pixel PXL. For example, if the pixel PXL is disposed on an i-th (i is a natural number) horizontal line (row) and a j-th (j a natural number) vertical line (column) of the display area DA, the pixel circuit PXC of the pixel PXL may be electrically connected to an i-th scan line Si and a j-th data line Dj of the display area DA.

In one or more embodiments, the pixel circuit PXC may include a plurality of transistors and at least one capacitor. For example, the pixel circuit PXC may include a first transistor T1, a second transistor T2, and a storage capacitor Cst.

The first transistor T1 may be electrically connected between the first power supply VDD and the light source unit LSU. For example, a first electrode (e.g., a source electrode) of the first transistor T1 may be electrically connected to the first power supply VDD, and a second electrode (e.g., a drain electrode) of the first transistor T1 may be electrically connected to the first electrode ELT1. A gate electrode of the first transistor T1 is electrically connected to a first node N1. The first transistor T1 may control driving current to be supplied to the light source unit LSU in response to the voltage of the first node N1. In other words, the first transistor T1 may be a driving transistor configured to control the driving current of the pixel PXL.

The second transistor T2 may be electrically connected between the data line Dj and the first node N1. For example, a first electrode (e.g., a source electrode) of the second transistor T2 may be electrically to the data line Dj, and a second electrode (e.g., a drain electrode) of the second transistor T2 may be electrically connected to the first node N1. A gate electrode of the second transistor T2 is electrically connected to the scan line Si. When a scan signal SSi having a gate-on voltage (e.g., a low level voltage) is supplied from the scan line Si, the second transistor T2 may be turned on to electrically connect the first node N1 to the data line Dj.

During each frame period, a data signal DSj of a corresponding frame is supplied to the data line Dj, and the data signal DSj is transmitted to the first node N1 through the second transistor T2 that is turned on during a period in which the scan signal SSi having the gate-on voltage (e.g., a low level voltage) is supplied. In other words, the second transistor T2 may be a switching transistor configured to transmit each data signal DSj to the interior of the pixel PXL.

One electrode of the storage capacitor Cst is electrically connected to the first power supply VDD, and the other electrode thereof is electrically connected to the first node N1. The storage capacitor Cst may be charged with a voltage (or holds a charge) corresponding to a data signal DSj to be supplied to the first node N1 during each frame period.

Although FIG. 4 illustrates that the transistors included in the pixel circuit PXC, e.g., both the first and second transistors T1 and T2, are p-type transistors, the present disclosure is not limited thereto. At least one of the first and second transistors T1 and T2 may be changed to an n-type transistor. In addition, the pixel circuit PXC may be formed of a pixel circuit that may have various structures and/or be operated by various driving schemes.

Referring to FIG. 5, the pixel circuit PXC may be further connected to a sensing control line SCLi and a sensing line SLj For example, the pixel circuit PXC of the pixel PXL disposed on the i-th horizontal line and the j-th vertical line of the display area DA may be electrically connected to an i-th sensing control line SCLi and a j-th sensing line SLj of the display area DA. The pixel circuit PXC may further include a third transistor T3. In one or more embodiments, the sensing line SLj may be omitted, and characteristics of the pixel PXL may be detected by detecting a sensing signal SENj through the data line Dj of the corresponding pixel PXL (or an adjacent pixel).

The third transistor T3 is electrically connected between the first transistor T1 and the sensing line SLj. For example, a first electrode of the third transistor T3 may be electrically connected to one electrode (e.g., a source electrode) of the first transistor T1 connected to the first electrode ELT1, and a second electrode of the third transistor T3 may be electrically connected to the sensing line SLj. In case that the sensing line SLj is omitted, the second electrode of the third transistor T3 may be electrically connected to the data line Dj.

A gate electrode of the third transistor T3 is connected to the sensing control line SCLi. In case that the sensing control line SCLi is omitted, the gate electrode of the third transistor T3 may be connected to the scan line Si. The third transistor T3 may be turned on by a sensing control signal SCSi having a gate-on voltage (e.g., a high level voltage) supplied to the sensing control line SCLi during a suitable sensing period (e.g., a set or predetermined sensing period), and thus electrically connect the sensing line SLj with the first transistor T1.

In one or more embodiments, the sensing period may be a period in which characteristics of each of the pixels PXL disposed in the display area DA (e.g., a threshold voltage, etc. of the first transistor T1) are extracted. During the sensing period, the first transistor T1 may be turned on by supplying a suitable reference voltage (e.g., a set or predetermined reference voltage) capable of turning on the first transistor T1 to the first node N1 through the data line Dj and the second transistor T2, or connecting each pixel PXL to a current source or the like. Furthermore, the third transistor T3 may be turned on by supplying a sensing control signal SCSi having a gate-on voltage (e.g., a high level voltage) to the third transistor T3, so that the first transistor T1 can be electrically connected to the sensing line SLj. Thereafter, a sensing signal SENj may be obtained through the sensing line SLj, and characteristics of each pixel PXL including the threshold voltage, etc. of the first transistor T1 may be detected using the sensing signal SENj. Information about the characteristics of each pixel PXL may be used to convert image data such that a deviation in characteristic between pixels PXL disposed in the display area DA can be compensated for.

Although FIG. 5 illustrates an embodiment where all of the first, second, and third transistors T1, T2, and T3 are n-type transistors, the present disclosure is not limited thereto. The present disclosure is not limited thereto. For example, at least one of the first, second, and third transistors T1, T2, and T3 may be changed to a p-type transistor.

Furthermore, although FIGS. 4 and 5 illustrate an embodiment in which valid light sources, i.e., light emitting elements LD, for forming each light source unit LSU are connected in parallel to each other, the present disclosure is not limited thereto. For example, as illustrated in FIG. 6, the light source unit LSU of each pixel PXL may have a serial structure. In the description of embodiments of FIG. 6, like reference numerals are used to designate components similar or equal to those of the embodiments of FIGS. 4 and 5 (e.g., the pixel circuit PXC), and detailed explanation thereof will be omitted.

Referring to FIG. 6, the light source unit LSU may include light emitting elements LD that form at least four serial sets and are connected in series/parallel to each other. In this case, each serial set may include a pair of electrodes (e.g., two electrodes), and at least one light emitting element LD electrically connected between the pair of electrodes. Here, the numbers of light emitting elements LD that form the respective serial sets may be identical with or different from each other. The number of light emitting elements LD of each serial set is not particularly limited. For example, a first serial set may include a first electrode ELT1, a second electrode ELT2, and at least one first light emitting element LD1 electrically connected between the first and second electrodes ELT1 and ELT2. A second serial set may include a third electrode ELT3, a fourth electrode ELT4, and at least one second light emitting element LD2 electrically connected between the third and fourth electrodes ELT3 and ELT4. Likewise, a third serial set may include a fifth electrode ELT5, a sixth electrode ELT6, and at least one third light emitting element LD3 electrically connected between the fifth and sixth electrodes ELT5 and ELT6. A fourth serial set may include a seventh electrode ELT7, an eighth electrode ELT8, and at least one fourth light emitting element LD4 electrically connected between the seventh and eighth electrodes ELT7 and ELT8.

An initial electrode of the light source unit LSU, e.g., the first electrode ELT1, may be a first pixel electrode (or an anode electrode) of the light source unit LSU. A last electrode of the light source unit LSU, e.g., the eighth electrode ELT8, may be a second pixel electrode (or a cathode electrode) of the light source unit LSU.

The other electrodes of the light source unit LSU, e.g., the second to seventh electrodes ELT2 to ELT7, may form respective intermediate electrodes. For example, the second electrode ELT2 and the third electrode ELT3 may be integrally or non-integrally connected to each other to form a first intermediate electrode IET1. Likewise, the fourth electrode ELT4 and the fifth electrode ELT5 may be integrally or non-integrally connected to each other to form a second intermediate electrode IET2. The sixth electrode ELT6 and the seventh electrode ELT7 may be integrally or non-integrally connected to each other to form a third intermediate electrode IET3. In this case, the second and third electrodes ELT2 and ELT3 may be integrated and regarded as the first intermediate electrode IET1. The fourth and fifth electrodes ELT4 and ELT5 may be integrated and regarded as the second intermediate electrode IET2. The sixth and seventh electrodes ELT6 and ELT7 may be integrated and regarded as the third intermediate electrode IET3.

On the assumption that the light source unit LSU is configured using the light emitting elements LD having the same conditions (e.g., the same size and/or number) as valid light sources, if the light emitting elements LD are connected to each other in a serial or serial/parallel combination structure, the power efficiency can be enhanced. For example, in the light source unit LSU in which the light emitting elements LD are connected in series or serial/parallel structure, the luminance to be expressed based on the same current may be higher than that of the case where the light emitting elements LD are connected only in parallel to each other. Furthermore, in the light source unit LSU in which the light emitting elements LD are connected in series or serial/parallel structure, driving current needed to express the same luminance may be reduced, compared to that of the case where the light emitting elements LD are connected in parallel to each other. Furthermore, in the pixel PXL in which the light emitting elements LD are connected in series or in a serial/parallel combination structure, even if a short-circuit defect or the like occurs in some serial sets, a certain degree of luminance can be expressed by the light emitting elements LD of the other serial sets, so that the probability of occurrence of a black spot defect in the pixel PXL may be reduced.

Figure 7:
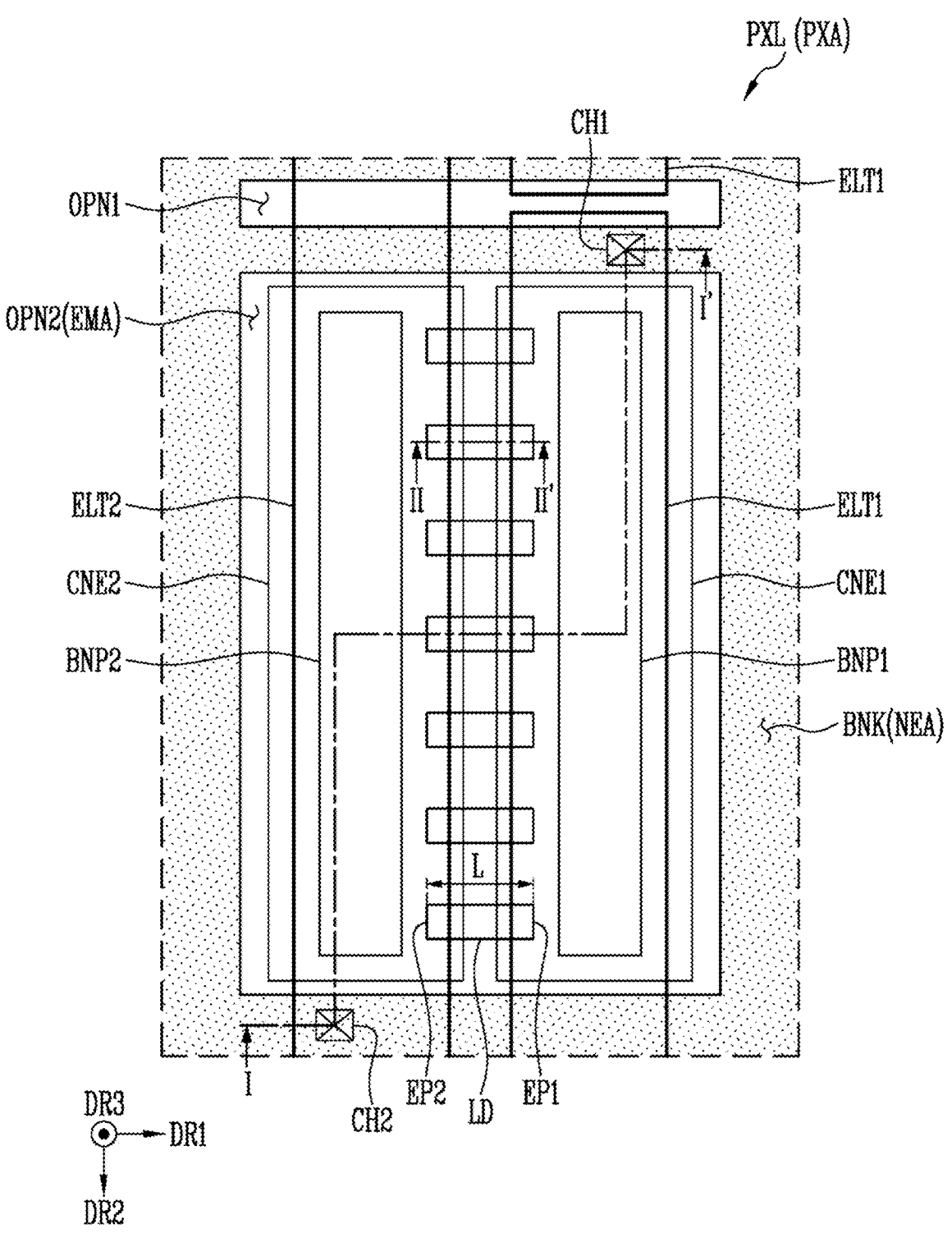
FIG. 7 is a plan view illustrating an embodiment of the pixel of each of FIGS. 4 and 5.

FIG. 7 is a plan view illustrating an embodiment of the pixel of each of FIGS. 4 and 5. For the sake of explanation, in FIG. 7, some of the transistors electrically connected to the light emitting elements LD and some of the signal lines electrically connected to the transistors will be omitted.

Referring to FIGS. 3 to 5 and 7, each pixel PXL may be formed in a pixel area PXA provided in the display area DA of the substrate SUB. The pixel area PXA may include an emission area EMA, and a non-emission area NEA formed in an area (e.g., a set or predetermined area) other than the emission area EMA. The non-emission area NEA may be an area that encloses the emission area EMA.

Each pixel PXL may include a bank BNK, a first bank pattern BNP1 (or a first pattern), a second bank pattern BNP2 (or a second pattern), a first electrode ELT1, a second electrode ELT2, a first contact electrode CNE1, a second contact electrode CNE2, and a light emitting element LD.

The bank BNK may be disposed in the non-emission area NEA of the pixel area PXA. With regard to the pixel PXL illustrated in the drawing and pixels PXL adjacent thereto, the bank BNK may be a structure for defining (or partitioning) the pixel areas PXA and/or the emission areas EMA of the respective pixels PXL. In one or more embodiments, during a process of supplying light emitting elements to each pixel PXL, the bank BNK may be a pixel defining layer or a dam structure for defining an area to which the light emitting elements LD are to be supplied. For example, because the emission area EMA of each pixel PXL is defined by the bank BNK, a mixed solution (e.g., ink) including a target amount and/or type of light emitting elements LD may be supplied (or input) to the emission area EMA.

The bank BNK may include at least one opening that exposes components disposed under the bank BNK in the pixel area PXA. For example, the bank BNK may include a first opening OPN1 and a second opening OPN2 that expose components disposed under the bank BNK. The first opening OPN1 of the bank BNK may be disposed adjacent to an upper side of the pixel area PXA. The second opening OPN2 of the bank BNK may correspond to the emission area EMA of the pixel PXL. The shown pixel PXL and an end of a first electrode ELT1 of a pixel PXL adjacent to the shown pixel PXL in the second direction DR2 may be disposed in the first opening OPN1. In the second opening OPN2, the first and second bank patterns BNP1 and BNP2, the light emitting elements LD, the first contact electrode CNE1, and the second contact electrode CNE2 may be disposed, and a portion of the first electrode ELT1 and a portion of the second electrode ELT2 may also be disposed.

The first and second bank patterns BNP1 and BNP2 may be disposed in the emission area EMA. The first and second bank patterns BNP1 and BNP2 may act as support for (e.g., may support) the first electrode ELT1 and the second electrode ELT2 to change surface profiles (or shapes) of the first electrode ELT1 and the second electrode ELT2 that will be described below, so that light emitted from the light emitting elements LD can be guided in an image display direction (e.g., in a third direction DR3) of the display device.

The first electrode ELT1 may extend in the second direction DR2. Here, the first electrode ELT1 of the shown pixel PXL may be separated from the first electrode ELT1 included in the pixel PXL adjacent thereto in the second direction DR2 in the first opening OPN1. In other words, after the light emitting elements LD are supplied and aligned in the pixel area PXA, a separation process for the first electrodes ELT1 in the first opening OPN1 of the bank BNK may be performed.

The second electrode ELT2 may be spaced from the first electrode ELT1 in the first direction DR1. The second electrode ELT2 may extend in the second direction DR2. The second electrode ELT2 of the shown pixel PXL may extend from a second electrode ELT2 included in the pixel PXL adjacent thereto in the second direction DR2.

The first electrode ELT1 and the second electrode ELT2 may be used as alignment electrodes in such a way that alignment voltages are applied thereto after a mixed solution (e.g., ink) including light emitting elements LD is supplied to the emission area EMA. The first electrode ELT1 may be a first alignment electrode, and the second electrode ELT2 may be a second alignment electrode. Here, the light emitting elements LD may be aligned in a desired direction and/or at desired positions by an electric field formed between the first alignment electrode and the second alignment electrode. Furthermore, the first electrode ELT1 and the second electrode ELT2 may function as driving electrodes for driving the light emitting elements LD after the light emitting elements LD have been aligned.

The first electrode ELT1 may be an anode of the light source unit LSU described with reference to FIGS. 4 and 5. Hence, the first electrode ELT1 may be physically and/or electrically connected, through a first contact hole CH1, to the first transistor T1 described with reference to FIG. 4.

The second electrode ELT2 may be a cathode of the light source unit LSU described with reference to FIGS. 4 and 5. Hence, the second electrode ELT2 may be physically and/or electrically connected, through a second contact hole CH2, to the second power line PL2 (or the second power supply VSS) described with reference to FIGS. 4 and 5.

In a plan view, the first and second electrodes ELT1 and ELT2 each may have a bar shape extending in the second direction DR2, but the present disclosure is not limited thereto. The shape of each of the first and second electrodes ELT1 and ELT2 may be changed in various ways.

The first contact electrode CNE1 may be disposed to overlap the first end EP1 of each of the light emitting elements LD and the first electrode ELT1. Hence, the first contact electrode CNE1 may electrically and/or physically connect the first end EP1 of the light emitting element LD with the first electrode ELT1.

The second contact electrode CNE2 may be disposed to overlap the second end EP2 of each of the light emitting elements LD and the second electrode ELT2. Hence, the second contact electrode CNE2 may electrically and/or physically connect the second end EP2 of the light emitting element LD with the second electrode ELT2.

In a plan view, the first contact electrode CNE1 and the second contact electrode CNE2 each may have a bar shape extending in the second direction DR2, but the present disclosure is not limited thereto. In one or more embodiments, the shape of each of the first contact electrode CNE1 and the second contact electrode CNE2 may be changed in various ways within a range in which the first and second contact electrodes CNE1 and CNE2 can be reliably electrically connected to each of the light emitting elements LD. The shape of each of the first contact electrode CNE1 and the second contact electrode CNE2 may be changed in various ways, taking into account connection relationship with the first electrode ELT1 and the second electrode ELT2 that are disposed thereunder.

Each of the light emitting elements LD may be disposed between the first electrode ELT1 and the second electrode ELT2 such that the longitudinal direction (L) thereof is parallel to the first direction DR1. In a plan view, the light emitting element LD may be disposed between the first and second bank patterns BNP1 and BNP2 that are adjacent to each other.

The first end EP1 (or one end) of the light emitting element LD may overlap the first electrode ELT1 and the first contact electrode CNE1. The first end EP1 of the light emitting element LD may be physically and/or electrically connected with the first electrode ELT1 and the first contact electrode CNE1.

The second end EP2 (or the other end) of the light emitting element LD may overlap the second electrode ELT2 and the second contact electrode CNE2. The second end EP2 of the light emitting element LD may be physically and/or electrically connected with the second electrode ELT2 and the second contact electrode CNE2.

Figure 8:
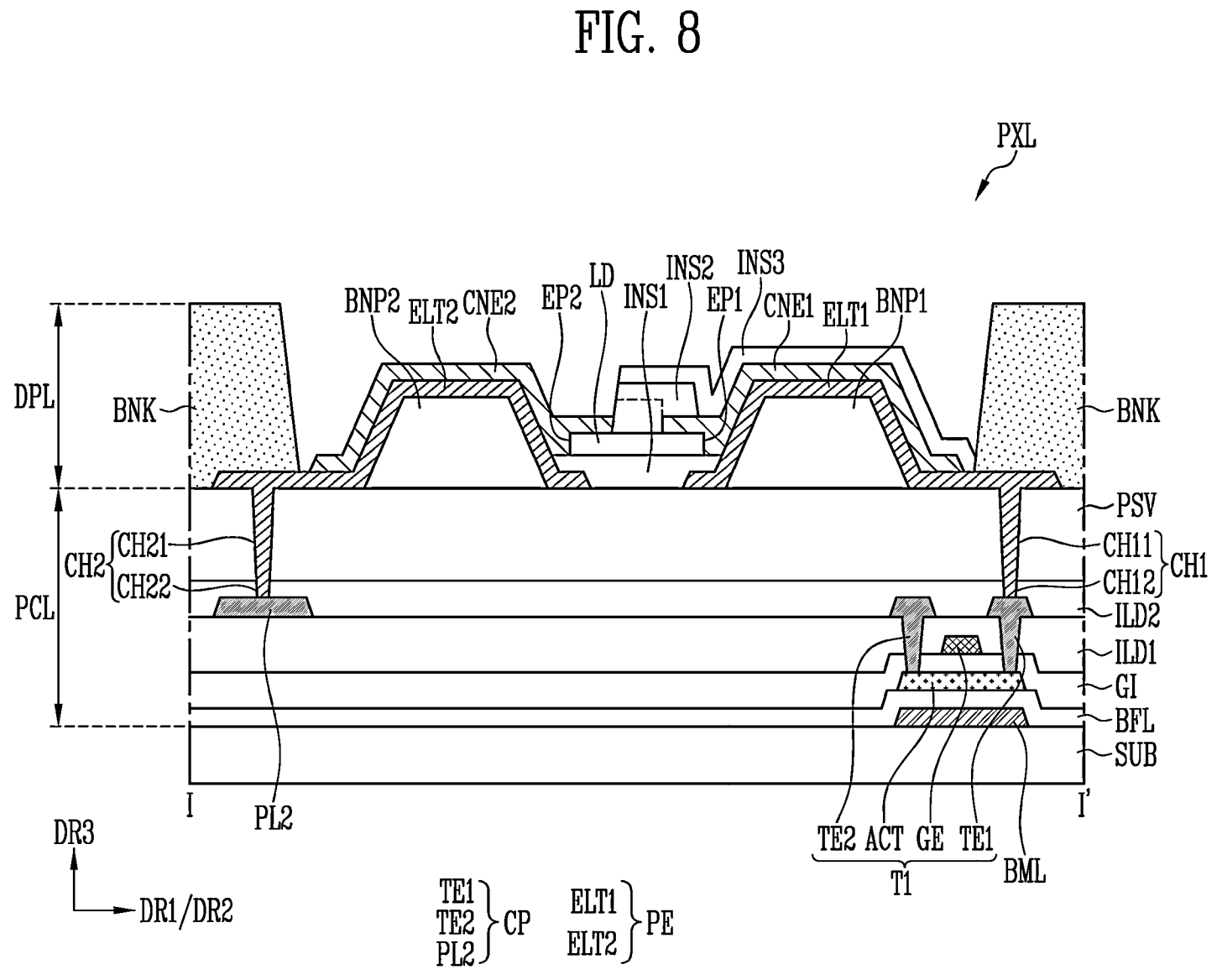

FIG. 8 is a sectional view taken along the line I-I' of FIG. 7. FIG. 8 illustrates a first transistor T1 (refer to FIGS. 4 and 5) and a second power line PL2, as an example of circuit elements that may be disposed on a pixel circuit layer PCL.

Referring to FIGS. 3 to 5, 7, and 8, the display device (or the pixel PXL) may include a substrate SUB, the pixel circuit layer PCL, and a display element layer DPL.

The pixel circuit layer PCL may include a bottom metal layer BML (or an auxiliary electrode layer), a buffer layer BFL, a first transistor T1, a conductive layer CP (a conductor, or a conductive pattern), a plurality of insulating layers GI, ILD1, ILD2, and a passivation layer PSV.

The bottom metal layer BML may be disposed between the substrate SUB and the buffer layer BFL. The bottom metal layer BML may be included in the first transistor T1. The bottom metal layer BML and a gate electrode GE of the first transistor T1 may overlap each other in the third direction with the buffer layer BFL interposed therebetween. The bottom metal layer BML may be disposed under a semiconductor pattern ACT of the first transistor T1. Here, the bottom metal layer BML may function as a light block pattern to stabilize operation characteristics of the first transistor T1.

In one or more embodiments, the first transistor T1 may not include the bottom metal layer BML. In this case, the buffer layer BFL may be disposed directly on the substrate SUB. In one or more embodiments, the bottom metal layer BML may be physically and/or electrically connected with the first transistor electrode TE1 of the first transistor T1, which will be described below, through a contact hole of an insulating layer. Hence, the threshold voltage of the first transistor T1 may be shifted in a negative direction or a positive direction.

The buffer layer BFL may cover the substrate SUB and the bottom metal layer BML and may be disposed on the substrate SUB.

The buffer layer BFL may prevent impurities from diffusing into the pixel circuit layer PCL. The buffer layer BFL may be an inorganic insulating layer formed of inorganic material. For example, the buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be omitted depending on the material of the substrate SUB or processing conditions.

The first transistor T1 may include a semiconductor pattern ACT, a gate electrode GE, a first transistor electrode TE1, and a second transistor electrode TE2. For example, the first transistor electrode TE1 may be a drain electrode, and the second transistor electrode TE2 may be a source electrode. In one or more embodiments, the first transistor electrode TE1 may be a source electrode, and the second transistor electrode TE2 may be a drain electrode.

The semiconductor pattern ACT may be disposed on the buffer layer BFL. The semiconductor pattern ACT may include a first area (e.g., a drain area) connected to the first transistor electrode TE1, a second area (e.g., a source area) connected to the second transistor electrode TE2, and a channel area formed between the first and second areas. The channel area may overlap the gate electrode GE of the first transistor T1 in the third direction DR3. The semiconductor pattern ACT may be a semiconductor pattern formed of polycrystalline silicon, amorphous silicon, an oxide semiconductor, etc.

The gate insulating layer GI may be disposed on the semiconductor pattern ACT to cover the semiconductor pattern ACT and the buffer layer BFL. The gate insulating layer GI may be an inorganic insulating layer including inorganic material. For example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). In one or more embodiments, the gate insulating layer GI may be formed of an organic insulating layer including organic material. The gate insulating layer GI may be provided in a single-layer structure, or may also be provided in a multilayer structure having two or more layers.

The gate electrode GE may be disposed on the gate insulating layer GI to overlap the channel area of the semiconductor layer ACT in the third direction DR3. The gate electrode GE may have a single-layer structure formed of one or combination selected from the group consisting of copper (Cu), molybdenum (Mo), tungsten (W), aluminum neodymium (AlNd), titanium (Ti), aluminum (Al), silver (Ag), and an alloy thereof. Furthermore, the gate electrode GE may have a double-layer or multi-layer structure formed of molybdenum (Mo), titanium (Ti), copper (Cu), aluminum (Al), or silver (Ag), which is low-resistance material.

A first interlayer insulating layer ILD1 may be disposed on the gate electrode GE to cover the gate electrode GE and the gate insulating layer GI. The first interlayer insulating layer ILD1 may include the same material as that of the gate insulating layer GI, or may include one or more materials selected from among materials exemplified as the material for forming the gate insulating layer GI.

The first interlayer insulating layer ILD1 may include a contact hole to be used to connect the first transistor electrode TE1 of the first transistor T1 and the second transistor electrode TE2 of the first transistor T1 to the first area and the second area of the semiconductor pattern ACT, respectively.

The conductive layer CP may be disposed on the first interlayer insulating layer ILD1. The conductive layer CP may include the first transistor electrode TE1 of the first transistor T1, the second transistor electrode TE2 of the first transistor T1, and the second power line PL2.

The first transistor electrode TE1 and the second transistor electrode TE2 may be respectively connected to the first area and the second area of the semiconductor pattern ACT through contact holes which successively pass through the gate insulating layer GI and the first interlayer insulating layer ILD1.

The second power line PL2 may have the same configuration as that of the second power line PL2 described with reference to FIGS. 4 and 5. Hence, a voltage of the second power supply VSS may be applied to the second power line PL2. In one or more embodiments, the pixel circuit layer PCL may further include the first power line PL1 connected to the first power supply. The first power line PL1 may be electrically connected with a component of the display element layer DPL, e.g., the first electrode ELT1 of the display element layer DPL. The second power line PL2 may be electrically connected with another component of the display element layer DPL, e.g., the second electrode ELT2 of the display element layer DPL.

Although in the present embodiment there has been described that the second power line PL2 is disposed on (or at) the same layer as that of the first transistor electrode TE1 and the second transistor electrode TE2 of the first transistor T1, the present disclosure is not limited thereto. In one or more embodiments, the second power line PL2 may be provided on (or at) the same layer as that of any one conductive layer of the conductive layers provided in the pixel circuit layer PCL.

The second interlayer insulating layer ILD2 may be disposed on the first interlayer insulating layer ILD1 to cover the first interlayer insulating layer ILD1 and the conductive layer CP. The second interlayer insulating layer ILD2 may be an inorganic insulating layer including inorganic material or an organic insulating layer including organic material. In one or more embodiments, the second interlayer insulating layer ILD2 may include the same material as that of the first interlayer insulating layer ILD1, but the present disclosure is not limited thereto. Although the second interlayer insulating layer ILD2 may be provided in a single-layer structure, in one or more embodiments, the second interlayer insulating layer ILD2 may be provided in a multi-layer structure having two or more layers. In one or more embodiments, the second insulating layer ILD2 may be omitted.

The second interlayer insulating layer ILD2 may include a 1-2-th contact hole CH12 that exposes the first transistor electrode TE1 of the first transistor T1, and a 2-2-th contact hole CH22 that exposes the second power line PL2. The 1-2-th contact hole CH12 along with a 1-1-th contact hole CH11 to be described below may form the first contact hole CH1. The first transistor electrode TE1 of the first transistor T1 may be physically and/or electrically connected with the first electrode ELT1 through the first contact hole CH1. The 2-2-th contact hole CH22 along with a 2-1-th contact hole CH21 to be described below may form the second contact hole CH2. The second power line PL2 may be physically and/or electrically connected with the second electrode ELT2 through the second contact hole CH2.

The passivation layer PSV may be disposed on the second interlayer insulating layer ILD2 (or the conductive layer CP).

The passivation layer PSV may include an inorganic insulating layer and/or an organic insulating layer. The inorganic insulating layer may include at least one of silicon oxide ($SiO_x$), silicon nitride ($SiN_x$), silicon oxynitride ($SiO_xN_y$), and metal oxide such as aluminum oxide ($AlO_x$). The organic insulating layer may include at least one of polyacrylates resin, epoxy resin, phenolic resin, polyamides resin, polyimides rein, unsaturated polyesters resin, polyphenylen ethers resin, poly-phenylene sulfides resin, and benzocyclobutene resin.

The passivation layer PSV may include a 1-1-th contact hole CH11 that exposes the first transistor electrode TE1 of the first transistor T1, and a 2-1-th contact hole CH21 that exposes the second power line PL2. The 1-1-th contact hole CH11 along with the 1-2-th contact hole CH12 described above may form the first contact hole CH1. The first transistor electrode TE1 of the first transistor T1 may be physically and/or electrically connected with the first electrode ELT1 through the first contact hole CH1. The 2-1-th contact hole CH21 along with 2-2-th contact hole CH22 described above may form the second contact hole CH2. The second power line PL2 may be physically and/or electrically connected with the second electrode ELT2 through the second contact hole CH2.

The display element layer DPL may be disposed on the passivation layer PSV.

The display element layer DPL may include the first and second bank patterns BNP1 and BNP2, the pixel electrode layer PE, the bank BNK, the light emitting element LD, the first contact electrode CNE1, the second contact electrode CNE2, and a plurality of insulating layers INS1, INS2, and INS3.

The first and second bank patterns BNP1 and BNP2 may be disposed on the passivation layer PSV.

The first and second bank patterns BNP1 and BNP2 each may have a trapezoidal cross-section that is reduced in width from one surface (e.g., an upper surface) of the passivation layer PSV upward in the third direction DR3. In one or more embodiments, each of the first and second bank patterns BNP1 to BNP2 may include a curved surface having a cross-sectional shape such as a semi-elliptical shape or a semi-circular shape (or a hemispherical shape) which is reduced in width from one surface of the passivation layer PSV upward in the third direction DR3. In a cross-sectional view, the shape of the first and second bank patterns BNP1 and BNP2 is not limited to the foregoing examples, and may be changed in various ways within a range in which the efficiency of light emitted from each of the light emitting elements LD can be enhanced.

The first and second bank patterns BNP1 and BNP2 may be an inorganic insulating layer including inorganic material or an organic insulating layer including organic material. In one or more embodiments, the first and second bank patterns BNP1 and BNP2 each may include an organic insulating layer having a single-layer structure and/or an inorganic insulating layer having a single-layer structure, but the present disclosure is not limited thereto. In one or more embodiments, the first and second bank patterns BNP1 and BNP2 may be omitted.

The pixel electrode layer PE may be disposed on the passivation layer PSV and the first and second bank patterns BNP1 and BNP2. The pixel electrode layer PE may include the first electrode ELT1 and the second electrode ELT2.

The first electrode ELT1 may be disposed on the first bank pattern BNP1, and the second electrode ELT2 may be disposed on the second bank pattern BNP2. In a sectional view, the first electrode ELT1 may have a surface profile corresponding to a shape of the first bank pattern BNP1, and the second electrode ELT2 may have a surface profile corresponding to a shape of the second bank pattern BNP2. In one or more embodiments, in case that the first and second bank patterns BNP1 and BNP2 are omitted, the first and second electrodes ELT1 and ELT2 may be disposed on the passivation layer PSV.

The first electrode ELT1 and the second electrode ELT2 each may be formed of material having a suitable reflectivity (e.g., a set or predetermined reflectivity) to enable light emitted from the light emitting element LD to travel in an image display direction (e.g., in the third direction DR3) of the display device. For example, the first electrode ELT1 and the second electrode ELT2 each may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), or an alloy thereof. The first electrode ELT1 and the second electrode ELT2 each may be formed of a single layer or multiple layers including the foregoing metal. In one or more embodiments, the first electrode ELT1 and the second electrode ELT2 each may include conductive oxide such as indium tin oxide (ITO), indium zinc oxide (IZO), zinc oxide (ZnO$_x$), indium gallium zinc oxide (IGZO), or indium tin zinc oxide (ITZO), and a conductive polymer such as PEDOT (poly(3,4-ethylenedioxythiophene)).

The first electrode ELT1 may be physically and/or electrically connected with the first transistor electrode TE1 of the first transistor T1 through the first contact hole CH1.

The second electrode ELT2 may be physically and/or electrically connected with the second power line PL2 through the second contact hole CH2.

The first insulating layer INS1 may be disposed on the passivation layer PSV to cover at least a portion of each of the first and second electrodes ELT1 and ELT2. The first insulating layer INS1 may be disposed between the first electrode ELT1 and the second electrode ELT2 so that the first electrode ELT1 and the second electrode ELT2 may be prevented from short-circuiting with each other.

In one or more embodiments, the first insulating layer INS1 may be primarily formed to cover the overall surfaces of the first and second electrodes ELT1 and ELT2. As such, after the first and second electrodes ELT1 and ELT2 are formed, the first and second electrodes ELT1 and ELT2 are covered with the first insulating layer INS1 and thus may be prevented from being damaged during a subsequent process. After the light emitting elements LD are supplied and aligned, the first insulating layer INS1 may be partially open to expose one area of each of the first and second electrodes ELT1 and ELT2.

The first insulating layer INS1 may be formed of an inorganic insulating layer including inorganic material, or an organic insulating layer including organic material. For example, the first insulating layer INS1 may include at least one of silicon nitride (SiN$_x$), silicon oxide (SiO$_x$), silicon oxynitride (SiO$_x$N$_y$), and metal oxide such as aluminum oxide (AlO$_x$), but the present disclosure is not limited thereto. The first insulating layer INS1 may be formed of an inorganic insulating layer or an organic insulating layer having an advantage in protecting the light emitting elements LD from the pixel circuit layer PCL.

The light emitting elements LD may be disposed on the first insulating layer INS1. The first end EP1 of each of the light emitting elements LD may be disposed to face (or oppose) the first electrode ELT1. The second end EP2 of each of the light emitting elements LD may be disposed to face (or oppose) the second electrode ELT2.

The first end EP1 of the light emitting element LD may partially overlap the first electrode ELT1 in the third direction DR3. The second end EP2 of the light emitting element LD may partially overlap the second electrode ELT2 in the third direction DR3.

The bank BNK may be disposed on the passivation layer PSV. The bank BNK may be disposed to at least partially overlap the first electrode ELT1 and the second electrode ELT2. At the step of supplying the light emitting elements LD to the emission area EMA, the bank BNK may be a dam structure configured to prevent a solution including the light emitting elements LD from being drawn into the emission area EMA of an adjacent pixel PXL or control the amount of solution such that a constant amount of solution is supplied to each emission area EMA.

The bank BNK may include light block material and/or reflective material, thus preventing a light leakage defect in which light (or rays) leaks between each pixel PXL and the pixels PXL adjacent thereto. In one or more embodiments, the bank BNK may include transparent material. For example, the bank BNK may include polyamides resin, polyimides resin, etc., but the present disclosure is not limited thereto. For example, the bank BNK may include color filter material or black matrix material. Alternatively, in order to enhance the efficiency of light emitted from the pixel PXL, a separate reflective material layer may be provided and/or formed on the bank BNK.

Although in the present embodiment the bank BNK has been described as being disposed on the passivation layer PSV, the present disclosure is not limited thereto. In one or more embodiments, in case that the first insulating layer INS1 is disposed in the non-emission area NEA, the bank BNK may be disposed on the first insulating layer INS1 and disposed to partially overlap the first electrode ELT1 and the second electrode ELT2.

A second insulating layer INS2 may be disposed on the light emitting element LD. The second insulating layer INS2 may be disposed on a portion of the upper surface of the light emitting element LD such that the first end EP1 and the second end EP2 of the light emitting element LD are exposed to the outside.

The second insulating layer INS2 may be formed of an organic insulating layer including organic material, depending on design conditions, etc. of the display device including the light emitting elements LD. After the arrangement of the light emitting elements LD in the pixel area PXA (refer to FIG. 7) have been completed, the second insulating layer INS2 is disposed on the light emitting elements LD so that the light emitting elements LD may be prevented from being removed from the aligned positions.

In case that a gap (or space) is present between the first insulating layer INS1 and the light emitting element LD before the formation of the second insulating layer INS2, the gap may be filled with the second insulating layer INS2 during a process of forming the second insulating layer INS2. In this case, the second insulating layer INS2 may be formed of an organic insulating layer that is suitable for filling the gap between the first insulating layer INS1 and the light emitting elements LD with the second insulating layer INS2.

In one or more embodiments, the second insulating layer INS2 may have a multi-layer structure, and include an inorganic insulating layer including at least one inorganic material or an organic insulating layer including at least one organic material. For example, the second insulating layer INS2 may include at least one of silicon nitride ($SiN_x$), silicon oxide ($SiO_x$), silicon oxynitride ($SiO_xN_y$), and metal oxide such as aluminum oxide ($AlO_x$), but the present disclosure is not limited thereto.

In one or more embodiments, a portion of the second insulating layer INS2 may be disposed on the first contact electrode CNE1. Although will be described with reference to FIGS. 19B and 19D, a portion of the second insulating layer INS2 may be disposed on the first contact electrode CNE1 during a process of forming the second insulating layer INS2 having a double-layer structure.

The first contact electrode CNE1 may be disposed on the first electrode ELT1 to cover the first electrode ELT1, and overlap the first insulating layer INS1, the light emitting element LD, and the second insulating layer INS2.

The first contact electrode CNE1 may directly contact the first end EP1 of the light emitting element LD and the first electrode ELT1, and physically and/or electrically reliably connect the first end EP1 of the light emitting element LD to the first electrode ELT1.

The first contact electrode CNE1 may include transparent conductive material such as indium tin oxide (ITO), indium zinc oxide (IZO), zinc oxide ($ZnO_x$), and indium gallium zinc oxide (IGZO).

The third insulating layer INS3 may be disposed on the second insulating layer INS2 and the first contact electrode CNE1 to cover the second insulating layer INS2 and the first contact electrode CNE1. The third insulating layer INS3 may be disposed such that a perimeter thereof comes into contact with one end of the second insulating layer INS2 so that the second end EP2 of the light emitting element LD is exposed.

The third insulating layer INS3 may be an inorganic insulating layer including inorganic material or an organic insulating layer including organic material. For example, the third insulating layer INS3 may include at least one of silicon nitride ($SiN_x$), silicon oxide ($SiO_x$), silicon oxynitride ($SiO_xN_y$), and metal oxides such as aluminum oxide ($AlO_x$), but the present disclosure is not limited thereto.

The second contact electrode CNE2 may be disposed on the second electrode ELT2 to cover the second electrode ELT2, and overlap the first insulating layer INS1 and the light emitting element LD, and contact the second insulating layer INS2.

The second contact electrode CNE2 may directly contact the second end EP2 of the light emitting element LD and the second electrode ELT2, and physically and/or electrically reliably connect the second end EP2 of the light emitting element LD to the second electrode ELT2.

The second contact electrode CNE2 may include transparent conductive material such as indium tin oxide (ITO), indium zinc oxide (IZO), zinc oxide ($ZnO_x$), and indium gallium zinc oxide (IGZO).

In one or more embodiments, a fourth insulating layer may be further disposed on the third insulating layer INS3, the second contact electrode CNE2, and the bank BNK to cover the third insulating layer INS3, the second contact electrode CNE2, and the bank BNK.

The fourth insulating layer may be an inorganic insulating layer including inorganic material or an organic insulating layer including organic material. For example, the fourth insulating layer may have a structure formed by alternately stacking at least one inorganic insulating layer and at least one organic insulating layer. The fourth insulating layer may cover the entirety of the display element layer DPL and prevent water or moisture from being drawn into the display element layer DPL including the light emitting elements LD from the outside.

In one or more embodiments, the display element layer DPL may selectively further include an optical layer as well as including the fourth insulating layer. For example, the display element layer DPL may further include a color conversion layer including color conversion particles for converting the color of light emitted from the light emitting elements LD to a specific color of light. Furthermore, the display element layer DPL may further include a color filter configured to allow light of only a specific wavelength band to pass therethrough. The color conversion layer will be described below with reference to FIGS. 17 and 18.

In one or more embodiments, at least one overcoat layer (e.g., a layer for planarizing an upper surface of the display element layer DPL) may be further disposed over the fourth insulating layer.

FIGS. 9 to 13 are sectional views illustrating an embodiment of the pixel taken along the line II-II' of FIG. 7. FIGS. 9 to 13 simply illustrate the pixel PXL centered on the display element layer DPL of FIG. 8.

Referring to FIGS. 7 to 13, the pixel PXL may include the first and second electrodes ELT1 and ELT2, the light emitting element LD, the first and second contact electrodes CNE1 and CNE2, and the first to third insulating layers INS1 to INS3 that are disposed on the passivation layer PSV (the pixel circuit layer PCL, or the substrate SUB).

Because the first and second electrodes ELT1 and ELT2, the light emitting element LD, the first and second contact electrodes CNE1 and CNE2, and the first to third insulating layers INS1 to INS3 have described with reference to FIG. 8, redundant explanation thereof will be omitted.

The first electrode ELT1 and the second electrode ELT2 may be spaced from each other in the first direction DR1. A distance D_ELT (i.e., a distance with respect to the first direction DR1) between the first electrode ELT1 and the second electrode ELT2 may be greater than approximately ¾ of the length L of the light emitting element LD, and be less than 1.5 times the length L of the light emitting element LD. For example, in case that the length L of the light emitting element LD ranges from approximately 3 μm to approximately 5 μm or is approximately 4 μm, the distance D_ELT between the first electrode ELT1 and the second electrode ELT2 may be approximately 3.5 μm. In case that the distance D_ELT is relatively small, the light emitting element LD may be aligned in a diagonal direction (e.g., a direction intersecting the first direction DR1 and the second direction DR2, based on FIG. 7) rather than being aligned such that the longitudinal direction (L) of the light emitting element LD is parallel to the first direction DR1. In this case, a defect (e.g., an open circuit or a short circuit) attributable to the misaligned light emitting element LD may be caused. On the other hand, in case that the distance D_ELT is relatively large, the light emitting elements LD may not be uniformly arranged with respect to the second direction DR2 (refer to FIG. 7), and a deviation in aligned positions of the light emitting elements LD with respect to the second direction DR2 may be caused. In this case, the light emitting element LD may not be connected to the first and second electrodes ELT1 and ELT2, so that the light quantity (or the emission efficiency) of the pixel PXL may be reduced.

The second insulating layer INS2 may include a first insulating pattern INS2-1 (or a 2-1-th insulating layer), a second insulating pattern INS2-2 (or a 2-2-th insulating layer). The first insulating pattern INS2-1 and the second insulating pattern INS2-2 may include the same material, or may include different materials.

The first insulating pattern INS2-1 may be disposed at the center between the first electrode ELT1 and the second electrode ELT2. For example, a distance between the first insulating pattern INS2-1 and the first electrode ELT1 may be the same as a distance between the first insulating pattern INS2-1 and the second electrode ELT2. The present disclosure is not limited thereto.

In one or more embodiments, a width of the first insulating pattern INS2-1 with respect to the first direction DR1 may be equal to or less than ⅓ of the distance D_ELT between the first electrode ELT1 and the second electrode ELT2. For example, the width of the first insulating pattern INS2-1 with respect to the first direction DR1 may be approximately 1 μm. Based on a reference line L_C (or a reference plane) crossing a central portion (or an intermediate point) between the first electrode ELT1 and the second electrode ELT2, the first insulating pattern INS2-1 may protrude toward the first electrode ELT1 by a first distance D1 and protrude toward the second electrode ELT2 by a second distance D2. For example, the first distance D1 and the second distance D2 each may be approximately 0.5 μm.

The first contact electrode CNE1 and the second contact electrode CNE2 may be spaced from each other in the first direction DR1 by the first insulating pattern INS2-1. Depending on the width of the first insulating pattern INS2-1, the distance between the first contact electrode CNE1 and the second contact electrode CNE2 with respect to the first direction DR1 may be equal to or less than ⅓ of the distance D_ELT between the first electrode ELT1 and the second electrode ELT2. For example, the first contact electrode CNE1 and the second contact electrode CNE2 may be spaced apart from each other in the first direction DR1 by approximately 1 μm.

Portions of the light emitting element LD that are exposed from the first insulating pattern INS2-1 may contact the first and second contact electrodes CNE1 and CNE2. The first contact electrode CNE1 may overlap the light emitting element LD by a first overlap distance D_OV1 with respect to the third direction DR3. The second contact electrode CNE2 may overlap the light emitting element LD by a second overlap distance D_OV2. For example, the sum of the first overlap distance D_OV1 and the second overlap distance D_OV2 may be approximately 3 μm. For example, the first overlap distance D_OV1 and the second overlap distance D_OV2 each may be approximately 1.5 μm. Even if an error occurs in alignment of the light emitting element LD, e.g., if an alignment position of the light emitting element LD is misaligned by approximately ±1 μm in the second direction DR2 based on the reference line L_C, the first and second contact electrodes CNE1 and CNE2 may contact the light emitting element LD. In other words, a contact defect between the light emitting element LD and the first and second contact electrodes CNE1 and CNE2 may be prevented or mitigated from occurring.

The second insulating pattern INS2-2 may be disposed on the first insulating pattern INS2-1, and partially cover the first contact electrode CNE1.

Figure 9:
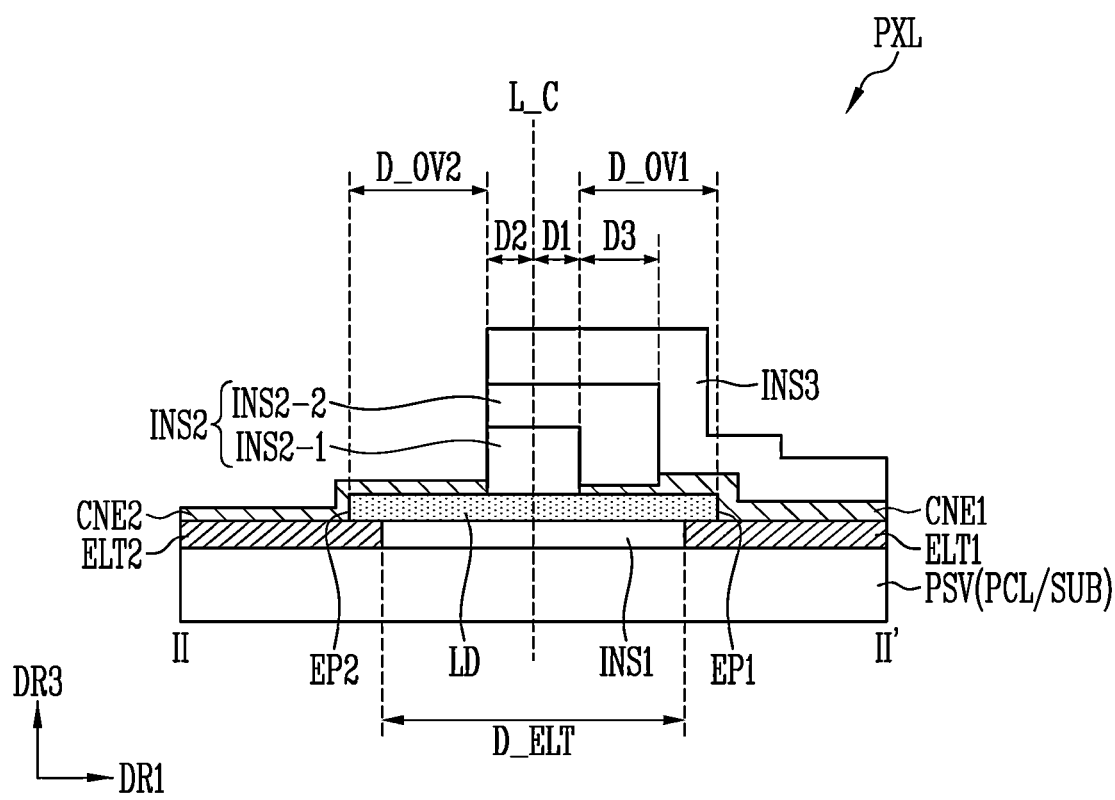
FIGS. 9 to 13 are sectional views illustrating an embodiment of the pixel taken along the line II-II' of FIG. 7.
Figure 10:
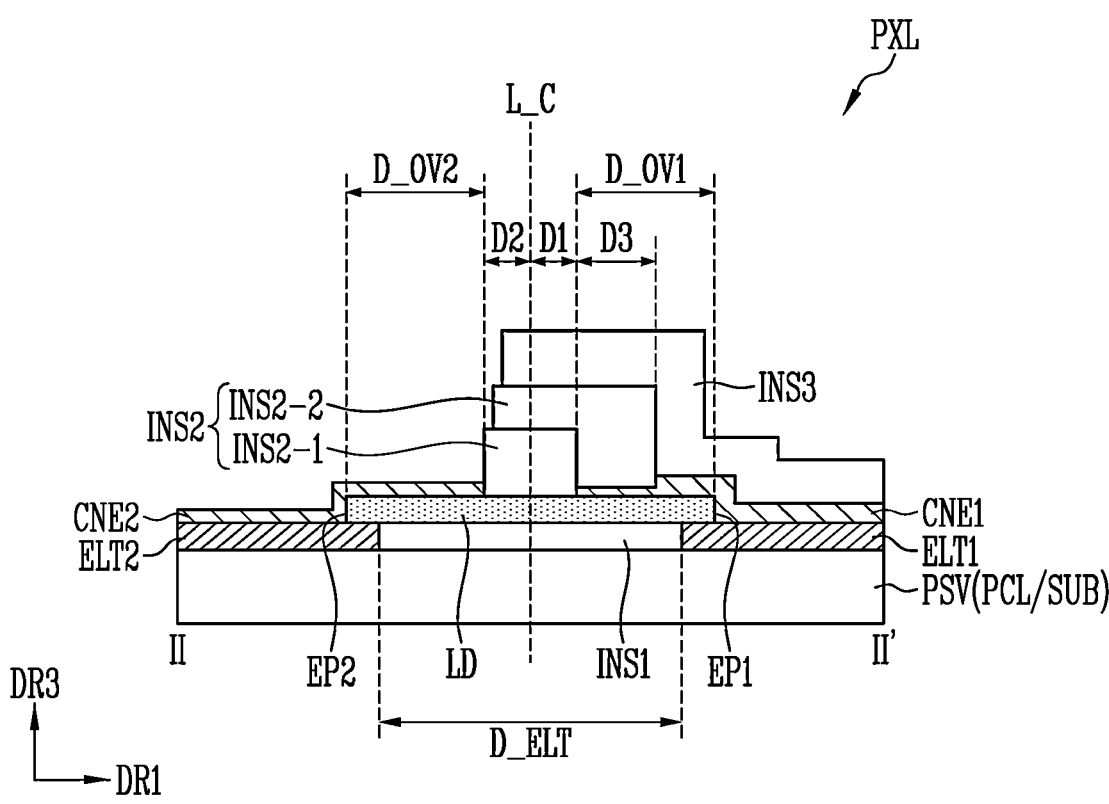

In one or more embodiments, the second insulating pattern INS2-2 may be over the light emitting element LD and closer to the first electrode ELT1 than to the second electrode ELT2. For example, a first end of the second insulating pattern INS2-2 (or a first side surface of the second insulating pattern INS2-2 that faces (or opposes) the first electrode ELT1) may protrude from a first end of the first insulating pattern INS2-1 by a third distance D3. For example, the width of the second insulating pattern INS2-2 with respect to the first direction DR1 may be approximately 2 μm, and the third distance D3 may be approximately 1 μm. For instance, as illustrated in FIG. 9, a second end of the second insulating pattern INS2-2 (or a second side surface of the second insulating pattern INS2-2 that faces (or opposes) the second electrode ELT2) may be disposed or aligned on the same level (or at the same plane) (e.g., coplanar) as that of a second end of the first insulating pattern INS2-1, but the present disclosure is not limited thereto. For example, as illustrated in FIG. 10, the second end of the second insulating pattern INS2-2 (or the second side surface of the second insulating pattern INS2-2 that faces (or opposes) the second electrode ELT2) may be disposed at a more inner side than the second end of the first insulating pattern INS2-1.

The second insulating pattern INS2-2 may cover a residue of the first contact electrode CNE1 that may be present on the first insulating pattern INS2-1 (e.g., the first insulating pattern INS2-1 having a relatively small width of approximately 1 μm), so that a short circuit between the first contact electrode CNE1 and the second contact electrode CNE2 may be prevented from occurring due to the residue of the first contact electrode CNE1.

The third insulating layer INS3 may be disposed on the second insulating pattern INS2-2. For example, as illustrated in FIG. 9, on the light emitting element LD, an end of the third insulating layer INS3 (e.g., an end of the third insulating layer INS3 that faces (or opposes) the second electrode ELT2) may be aligned (e.g., coplanar) with the second end of the first insulating pattern INS2-1 and the second end of the second insulating pattern INS2-2. In other words, the end of the third insulating layer INS3 (e.g., the end of the third insulating layer INS3 that faces (or opposes) the second electrode ELT2), the second end of the first insulating pattern INS2-1, and the second end of the second insulating pattern INS2-2 may have the same cross-sectional profile. The present disclosure is not limited thereto. For example, as illustrated in FIG. 10, the end of the third insulating layer INS3 (e.g., the end of the third insulating layer INS3 that faces (or opposes) the second electrode ELT2) may be disposed at a more inner side than the second end of the first insulating pattern INS2-1 and/or the second end of the second insulating pattern INS2-2.

In one or more embodiments, a stepped portion may be formed in one portion of the first contact electrode CNE1 that is covered by the second insulating pattern INS2-2. A thickness of the one portion of the first contact electrode CNE1 that is covered by the second insulating pattern INS2-2 may be less than an average thickness of the first contact electrode CNE1 (or a thickness of the other portion of the first contact electrode CNE1 that is not covered with the second insulating pattern INS2-2). For example, the thickness of the one portion of the first contact electrode CNE1 that is covered by the second insulating pattern INS2-2 may be equal to or less than approximately 850 Å, and the average thickness of the first contact electrode CNE1 may be greater than 850 Å. The thickness of the one portion of the first contact electrode CNE1 may be the same as a thickness (or an average thickness) of the second contact electrode CNE2, but the present disclosure is not limited thereto.

Although will be described below, to improve contact between the light emitting element LD and the first contact electrode CNE1, the first contact electrode CNE1 may be formed through two processes (i.e., through a double deposition process) before and after the second insulating pattern INS2-2 is formed. Consequently, the stepped portion may be formed in the first contact electrode CNE1.

Figure 11:
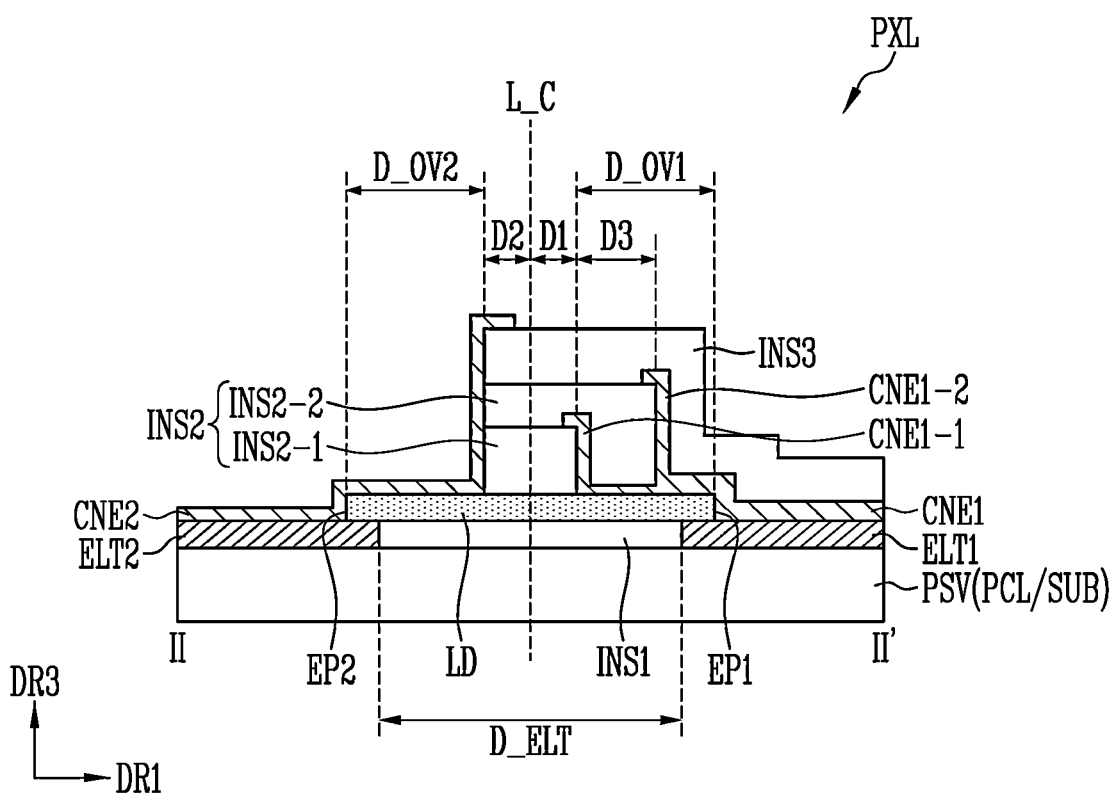
Figure 12:
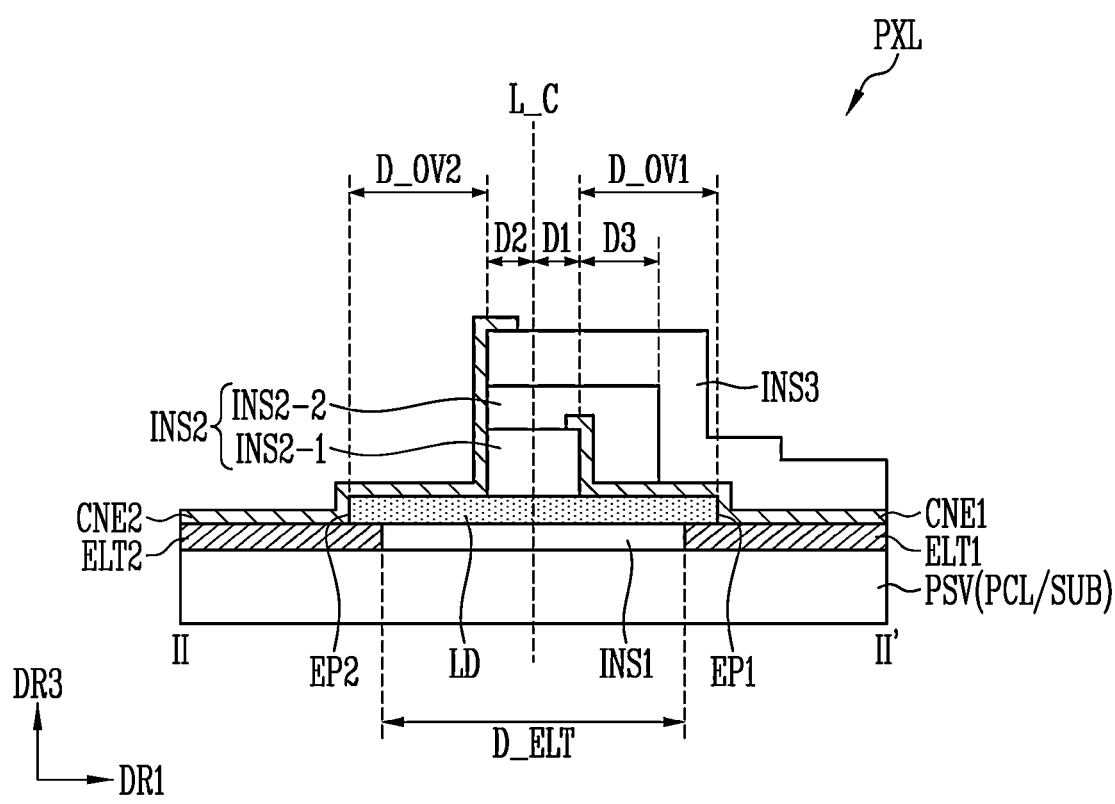

In one or more embodiments, the second contact electrode CNE2 may partially cover the third insulating layer INS3. As illustrated in FIGS. 11 and 12, the second contact electrode CNE2 may also be disposed on the end of the third insulating layer INS3. In other words, the second contact electrode CNE2 is formed after the third insulating layer INS3 is formed, and the second contact electrode CNE2 may be disposed on the end of the third insulating layer INS3 by a formation position and/or a process deviation of the second contact electrode CNE2.

In one or more embodiments, the first contact electrode CNE1 may partially cover the first insulating pattern INS2-1 and/or the second insulating pattern INS2-2. As illustrated in FIG. 11, the first contact electrode CNE1 may include a first part CNE1-1 disposed between the first insulating pattern INS2-1 and the second insulating pattern INS2-2, and a second part CNE1-2 disposed between the second insulating pattern INS2-2 and the third insulating pattern INS3. In other words, after the first insulating pattern INS2-1 is formed, the first contact electrode CNE1 (or the first part CNE1-1) may be primarily formed. After the second insulating pattern INS2-2 is formed, the first contact electrode CNE1 (or the second part CNE1-2) may be secondarily formed. The first contact electrode CNE1 may be disposed on the first end of the first insulating pattern INS2-1 and/or the first end of the second insulating pattern INS2-2 by a formation position and/or a process deviation of the first contact electrode CNE1.

Figure 13:
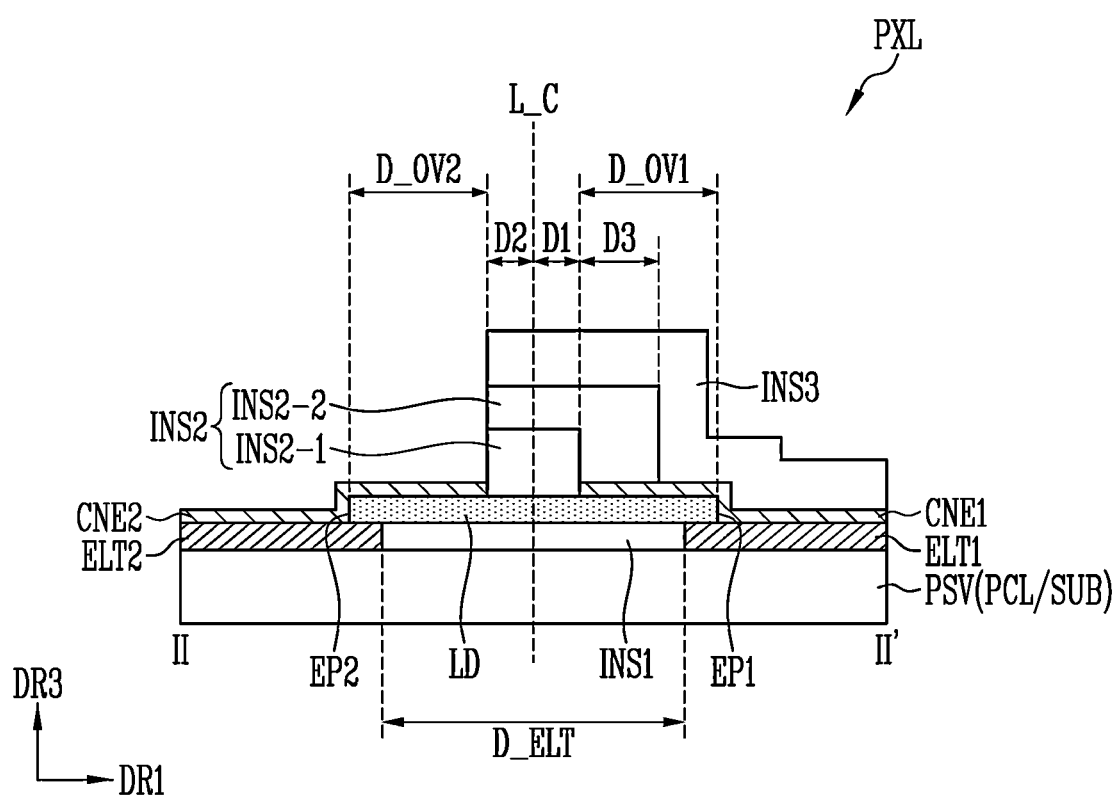

Although the stepped portion is formed in the first contact electrode CNE1, the present disclosure is not limited thereto. As illustrated in FIGS. 12 and 13, the thickness of the portion of the first contact electrode CNE1 that is covered by the second insulating pattern INS2-2 may be the same as the average thickness of the first contact electrode CNE1 (or the thickness of the other portion of the first contact electrode CNE1 that is not covered with the second insulating pattern INS2-2). The average thickness of the first contact electrode CNE1 may be the same as the average thickness of the second contact electrode CNE2, but the present disclosure is not limited thereto.

For example, the first contact electrode CNE1 may be formed after the first insulating pattern INS2-1 is formed, and the process of secondarily forming the first contact electrode CNE1 after the second insulating pattern INS2-2 is formed may be omitted. Hence, as illustrated in FIG. 12, the first contact electrode CNE1 may partially cover only the first insulating pattern INS2-1 without covering the second insulating pattern INS2-2.

As described above, the first and second contact electrodes CNE1 and CNE2 may be spaced from each other in the first direction DR1 by the first insulating pattern INS2-1. As the width of the first insulating pattern INS2-1 is reduced, a surface area (e.g., the first overlap distance D_OV1 and the second overlap distance D_OV2) with which the first and second contact electrodes CNE1 and CNE2 contact the light emitting element LD may be increased, and a contact defect between the light emitting element LD and the first and second contact electrodes CNE1 and CNE2 that results from a fabrication error may be prevented or mitigated.

Furthermore, the second insulating pattern INS2-2 that covers a portion of the first contact electrode CNE1 and the first insulating pattern INS2-1 may prevent an open circuit from being caused between the first contact electrode CNE1 and the second contact electrode CNE2 (e.g., a short circuit resulting from a residue of the first contact electrode CNE1 that is present on the first insulating pattern INS2-1).

Moreover, because the first contact electrode CNE1 is formed through total two processes (i.e., through a double deposition process) before and after the second insulating pattern INS2-2 is formed, contact between the light emitting element LD and the first contact electrode CNE1 may be further improved.

Figure 14:
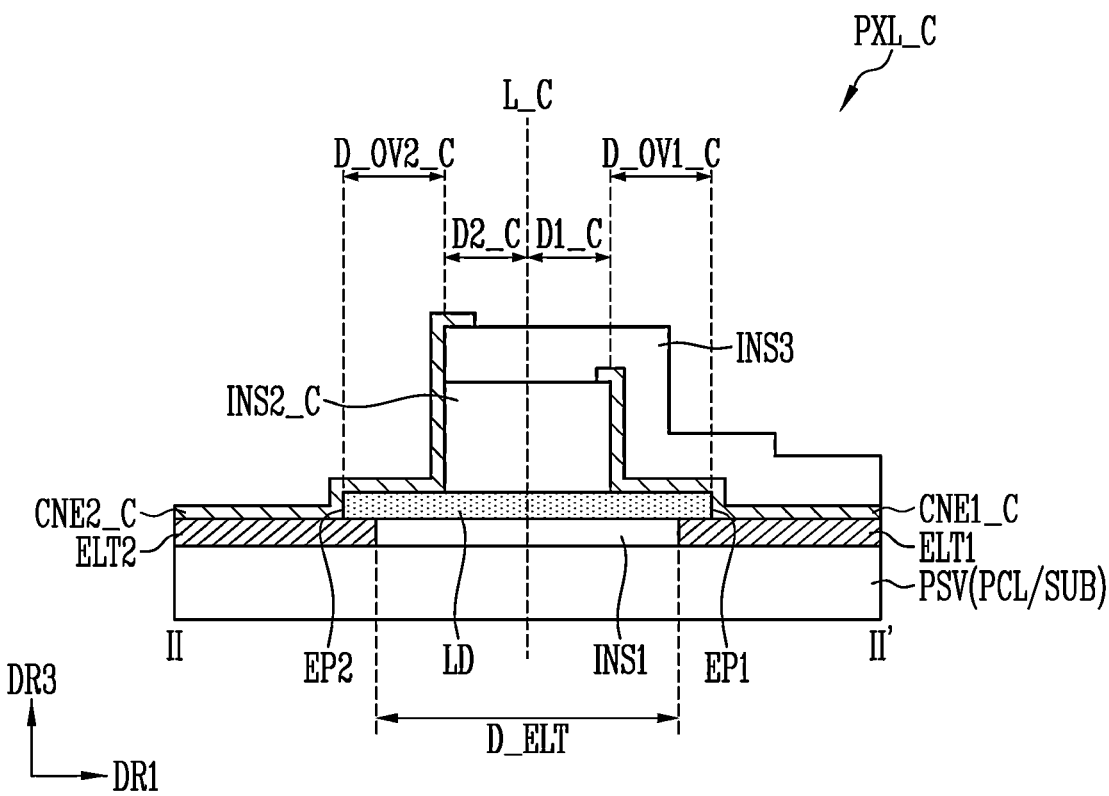
FIG. 14 is a sectional view illustrating a pixel in accordance with a comparative embodiment.
Figure 15:
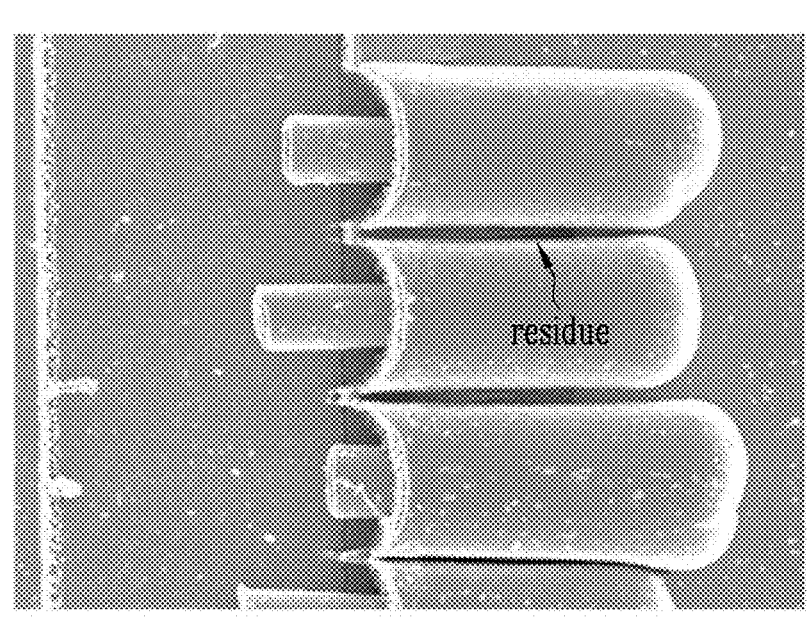
FIGS. 15 and 16 are views illustrating the pixel of FIG. 14 in accordance with the comparative embodiment.
Figure 16:
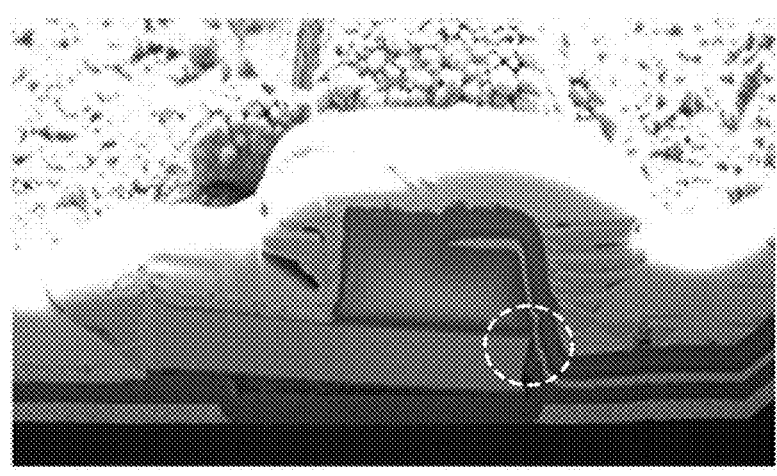

FIG. 14 is a sectional view illustrating a pixel PXL_C in accordance with a comparative embodiment. FIGS. 15 and 16 are views illustrating the pixel PXL_C in accordance with the comparative embodiment.

Referring to FIGS. 8 to 16, the pixel PXL_C of FIG. 14 is similar to the pixel PXL of FIG. 9 except for a second insulating layer INS2_C, and therefore, redundant explanation thereof will be omitted.

The second insulating layer INS2-C may be disposed at the center between the first electrode ELT1 and the second electrode ELT2.

A width of the second insulating layer INS2_C with respect to the first direction DR1 may be approximately 2 μm. Based on a reference line L_C (or a reference plane) crossing a central portion between the first electrode ELT1 and the second electrode ELT2, the second insulating layer INS2_C may protrude toward the first electrode ELT1 by a first distance D1_C and protrude toward the second electrode ELT2 by a second distance D2_C. For example, the first distance D1_C and the second distance D2_C each may be approximately 1 μm.

A first contact electrode CNE1_C may be formed after the second insulating layer INS2_C is formed. The first contact electrode CNE1_C may be disposed on the second insulating layer INS2_C. Likewise, a second contact electrode CNE2_C may be formed after the third insulating layer INS3 is formed. The second contact electrode CNE2_C may be disposed on the third insulating layer INS3.

In case that, as illustrated in FIG. 15, light emitting elements are disposed adjacent to each other, a residue of the first contact electrode CNE1_C may occur on the second insulating layer INS2_C, and a short circuit may be caused between the first contact electrode CNE1_C and the second contact electrode CNE2_C by the residue. To prevent the short circuit from being caused, the first contact electrode CNE1_C and the second contact electrode CNE2_C may be spaced from each other in the first direction DR1 by approximately 2 μm. To this end, a width of the second insulating layer INS2_C with respect to the first direction DR1 may be approximately 2 μm, the second insulating layer INS2_C being provided to space the first contact electrode CNE1_C and the second contact electrode CNE2_C apart from each other.

In this case, a surface area (or a first overlap distance D_OV1_C) with which the first contact electrode CNE1_C overlaps the light emitting element LD and a surface area (or a second overlap distance D_OV2_C) with which the second contact electrode CNE2_C overlaps the light emitting element LD may be reduced. For example, the sum of the first overlap distance D_OV1_C and the second overlap distance D_OV2_C may be approximately 2 μm, and each of the first overlap distance D_OV1_C and the second overlap distance D_OV2_C may be approximately 1 μm.

In case that, as illustrated in FIG. 16, the light emitting element is disposed at a relatively left side (e.g., biased to the left by approximately 0.5 μm or more or approximately 1 μm or more) by misalignment, and the second insulating layer INS2_C is disposed at a relatively right side (e.g., biased to the right by approximately 0.5 μm or more or approximately 1 μm or more), the first contact electrode CNE1_C (refer to FIG. 14) may not contact the light emitting element LD (refer to FIG. 14), as shown by a dotted line circuit of FIG. 16. In this case, the light emitting element LD may not form a valid light source, whereby the light quantity (or the emission efficiency) of the pixel PXL_C may be reduced.

Therefore, in the embodiments described with reference to FIGS. 9 to 13, the first insulating pattern INS2-1 may be used to secure sufficient overlap surface areas (e.g., the first overlap distance D_OV1 and the second overlap distance D_OV2) with which the first and second contact electrodes CNE1 and CNE2 overlap the light emitting element LD, and the second insulating pattern INS2-2 may be used to prevent a short circuit from being caused between the first and second contact electrodes CNE1 and CNE2.

Figure 17:
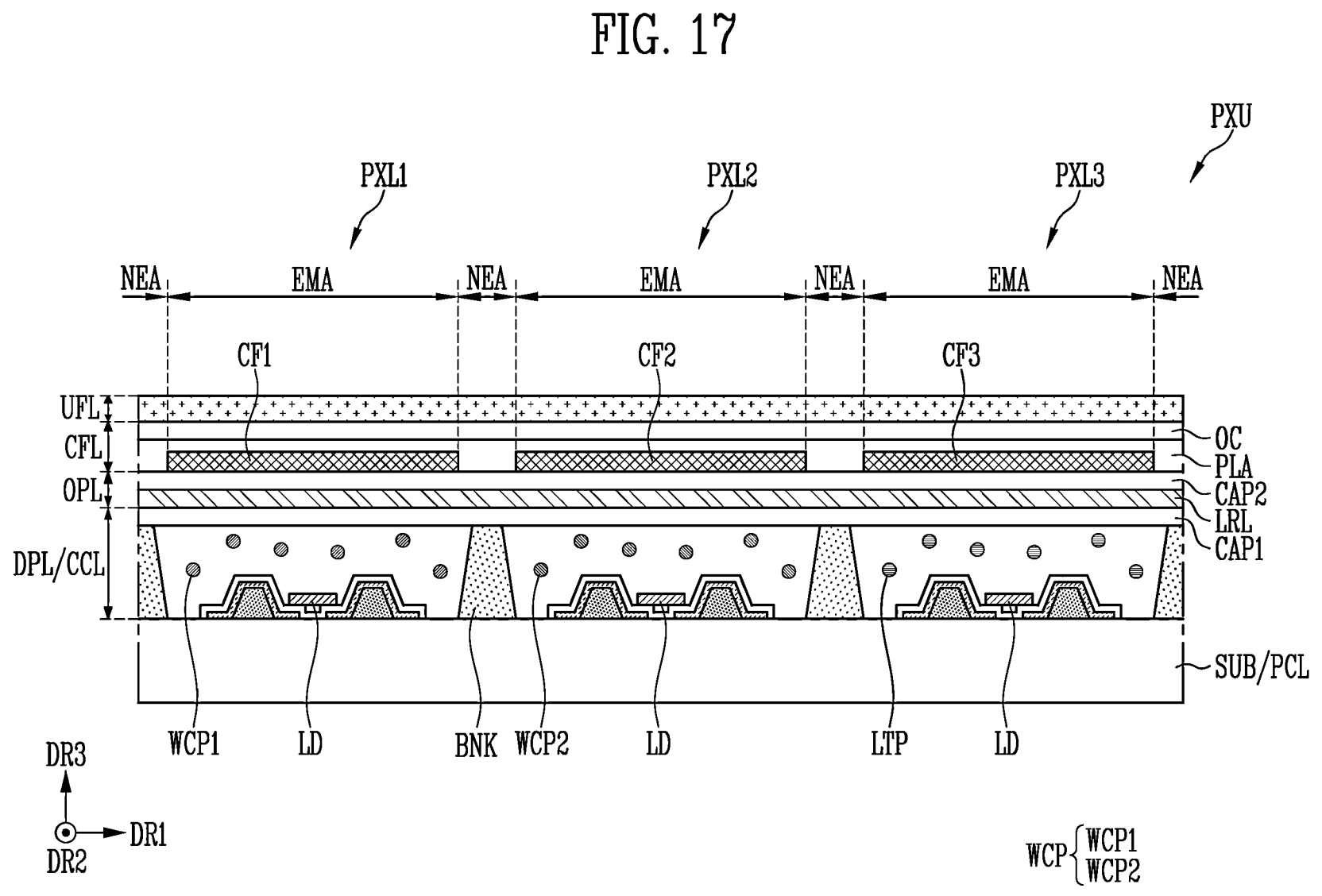
Figure 18:
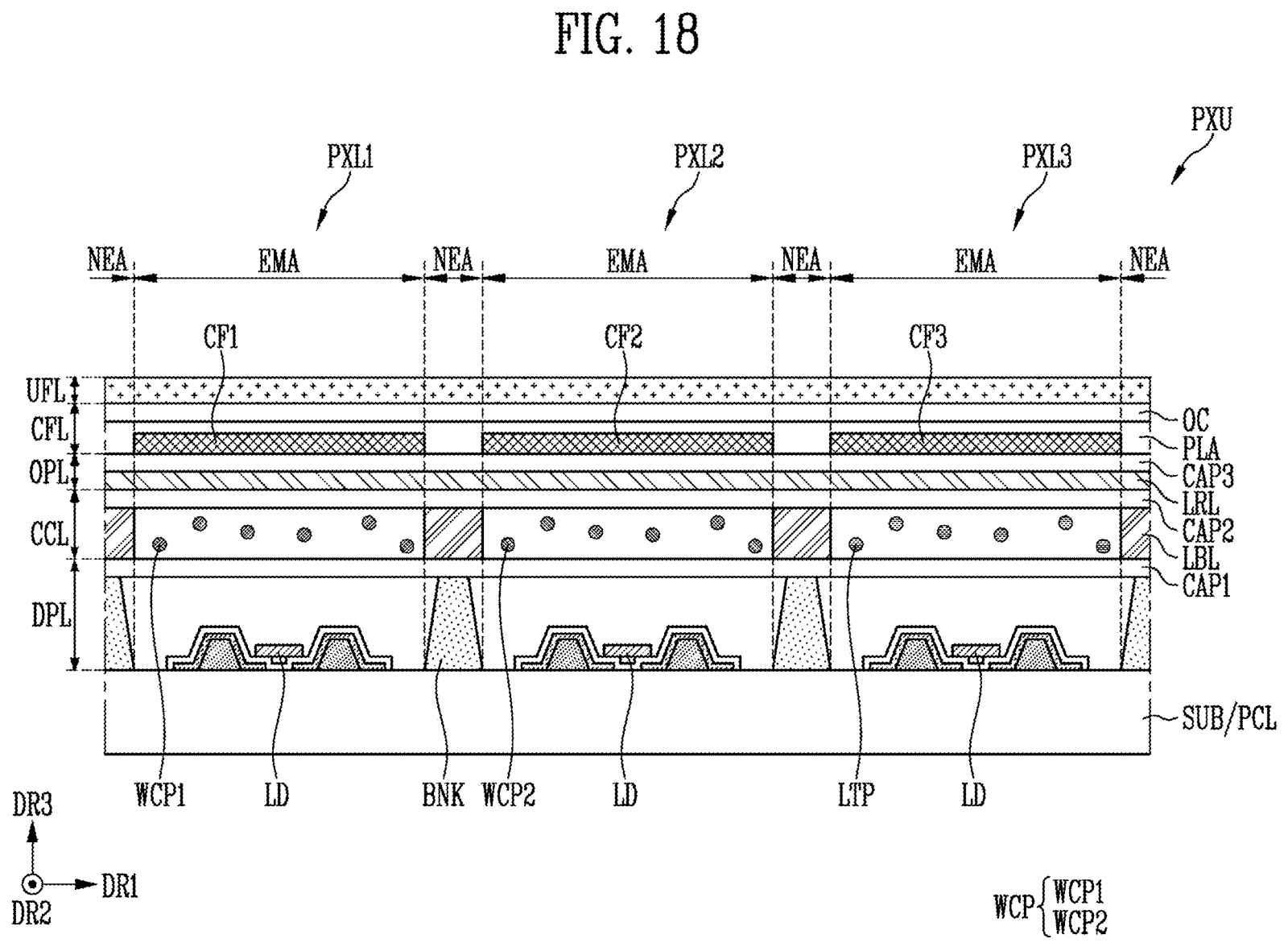

FIGS. 17 and 18 are sectional views each illustrating an embodiment of the pixel unit included in the display device of FIG. 3. For the sake of explanation, in FIGS. 17 and 18, the individual components of the pixel circuit layer PCL and the display element layer DPL are schematically illustrated.

Referring to FIG. 17, the light emitting elements LD that are respectively disposed in the first pixel PXL1, the second pixel PXL2, and the third pixel PXL3 may emit the same color of light. For example, the first pixel PXL1, the second pixel PXL2, and the third pixel PXL3 may include light emitting elements LD configured to emit a third color of light, e.g., blue light. A color conversion layer CCL and/or a color filter layer CFL may be provided in the first pixel PXL1, the second pixel PXL2, and the third pixel PXL3 so that a full-color image may be displayed. However, the present disclosure is not limited thereto. For example, the first pixel PXL1, the second pixel PXL2, and the third pixel PXL3 may include light emitting elements LD configured to emit different colors of light.

The color conversion layer CCL may be disposed on the same layer as that of the display element layer DPL. For example, the color conversion layer CCL may be disposed between the banks BNK.

The color conversion layer CCL may include a wavelength conversion pattern (or a color conversion particle) WCP, a light transmission pattern LTP, and a first capping layer CAP1. For example, the wavelength conversion pattern WCP may include a first wavelength conversion pattern WCP1, and a second wavelength conversion pattern WCP2.

The first wavelength conversion pattern WCP1 may be disposed to overlap the emission area EMA of the first pixel PXL1. For example, the first wavelength conversion pattern WCP1 may be provided between the banks BNK, and overlap the emission area EMA of the first pixel PXL1 in a plan view.

The second wavelength conversion pattern WCP2 may be disposed to overlap the emission area EMA of the second pixel PXL2. For example, the second wavelength conversion pattern WCP2 may be provided between the banks BNK, and overlap the emission area EMA of the second pixel PXL2 in a plan view.

The light transmission pattern LTP may be disposed to overlap the emission area EMA of the third pixel PXL3. For example, the light transmission pattern LTP may be provided between the banks BNK, and overlap the emission area EMA of the third pixel PXL3 in a plan view.

In one or more embodiments, the first wavelength conversion pattern WCP1 may include first color conversion particles that convert the third color of light emitted from the light emitting elements LD to a first color of light. For example, in case that the light emitting element LD is a blue light emitting element configured to emit blue light and the first pixel PXL1 is a red pixel, the first wavelength conversion pattern WCP1 may include first quantum dots that convert blue light emitted from the blue light emitting element to red light.

For example, the first wavelength conversion pattern WCP1 may include a plurality of first quantum dots dispersed in a suitable matrix material (e.g., a predetermined matrix material) such as base resin. The first quantum dots may absorb blue light, shift the wavelength thereof according to an energy transition, and thus emit red light. In case that the first pixel PXL1 is a pixel configured to emit a different color of light, the first wavelength conversion pattern WCP1 may include first quantum dots corresponding to the color of the first pixel PXL1.

In one or more embodiments, the second wavelength conversion pattern WCP2 may include second color conversion particles that convert the third color of light emitted from the light emitting elements LD to a second color of light. For example, in case that each light emitting element LD is a blue light emitting element configured to emit blue light and the second pixel PXL2 is a green pixel, the second wavelength conversion pattern WCP2 may include second quantum dots that convert blue light emitted from the blue light emitting element to green light.

For example, the second wavelength conversion pattern WCP2 may include a plurality of second quantum dots dispersed in a suitable matrix material (e.g., a predetermined matrix material) such as base resin. The second quantum dots may absorb blue light, shift the wavelength thereof according to an energy transition, and thus emit green light. In case that the second pixel PXL2 is a pixel configured to emit a different color of light, the second wavelength conversion pattern WCP2 may include second quantum dots corresponding to the color of the second pixel PXL2.

The first quantum dots and the second quantum dots each may have the form of a nanoparticle, a nanotube, nanofiber, a planar nanoparticle, etc. having a spherical shape, a pyramid shape, a multi-arm shape, or a cubic shape, but the present disclosure is not limited thereto. The shape of each of the first quantum dots and the second quantum dots may be changed in various ways.

In one or more embodiments, as blue light having a relatively short wavelength in a visible ray area is incident on each of the first quantum dots and the second quantum dots, absorption coefficients of the first quantum dot and the second quantum dot may be increased. Therefore, eventually, the efficiency of light emitted from the first pixel PXL1 and the second pixel PXL2 may be enhanced, and satisfactory color reproducibility may be secured. Furthermore, because the pixel unit including the first to third pixels PXL1, PXL2, and PXL3 is formed of light emitting elements LD (e.g., blue light emitting elements) configured to emit the same color of light, the efficiency of fabricating the display device may be enhanced.

In one or more embodiments, the light transmission pattern LTP may be provided to efficiently use the third color of light emitted from the light emitting elements LD. For example, in case that each light emitting element LD is a blue light emitting element configured to emit blue light and the third pixel PXL3 is a blue pixel, the light transmission pattern LTP may include at least one type of light scattering particles to efficiently use light emitted from the light emitting element LD.

For example, the light transmission pattern LTP may include a plurality of light scattering particles that are dispersed in a suitable matrix material (e.g., a predetermined matrix material) such as base resin. For example, the light transmission pattern LTP includes light scattering particles, but the constituent material of the light scattering particles is not limited thereto.

There is no need for the light scattering particles to be disposed in only the emission area EMA for the third pixel PXL3. For example, the light scattering particles may also be selectively included in the first and/or second wavelength conversion pattern WCP1 and/or WCP2.

The first capping layer CAP1 may seal (or cover) the wavelength conversion pattern WCP and the light transmission pattern LTP. The first capping layer CAP1 may be disposed between a low refractive layer LRL and the display element layer DPL. The first capping layer CAP1 may be provided over the first to third pixels PXL1, PXL2, and PXL3. The first capping layer CAP1 may prevent the color conversion layer CCL from being damaged or contaminated by permeation of external impurities such as water or air.

In one or more embodiments, the first capping layer CAP1 may be formed of a single layer or multiple layers including at least one insulating material from among silicon oxide ($SiO_x$), silicon nitride ($SiN_x$), silicon oxynitride ($SiO_xN_y$), aluminum oxide ($AlO_x$), and titanium dioxide ($TiO_x$), but the present disclosure is not limited thereto. In one or more embodiments, the insulating layer INF may be omitted.

An optical layer OPL may include the low refractive layer LRL and the second capping layer CAP2. The optical layer OPL may be disposed on the color conversion layer CCL. The optical layer OPL may be disposed on the display element layer DPL.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided over the first to third pixels PXL1, PXL2, and PXL3.

The low refractive layer LRL may function to recycle light provided from the color conversion layer CCL by total reflection and thus enhance the light efficiency. Hence, the low refractive layer LRL may have a relatively low refractive index compared to that of the color conversion layer CCL.

In one or more embodiments, the low refractive layer LRL may include base resin and hollow particles dispersed in the base resin. The hollow particles may be hollow silica particles. Alternatively, the hollow particles may have a pore formed by porogen, but the present disclosure is not limited thereto. Furthermore, the low refractive layer LRL may include at least one of a zinc oxide (ZnO) particle, a titanium dioxide (TiO2) particle, and a nano-silicate particle, but the present disclosure is not limited thereto.

The second capping layer CAP2 may be disposed on the low refractive layer LRL. The second capping layer CAP2 may be disposed between the color filter layer CFL and the low refractive layer LRL. The second capping layer CAP2 may be provided over the first to third pixels PXL1, PXL2, and PXL3. The second capping layer CAP2 may prevent the low refractive layer LRL from being damaged or contaminated by permeation of external impurities such as water or air.

In one or more embodiments, the second capping layer CAP2 may be formed of a single layer or multiple layers including at least one insulating material from among silicon oxide ($SiO_x$), silicon nitride ($SiN_x$), silicon oxynitride ($SiO_xN_y$), aluminum oxide ($AlO_x$), and titanium dioxide ($TiO_x$), but the present disclosure is not limited thereto.

The color filter layer CFL may be disposed on the second capping layer CAP2. The color filter layer CFL may be provided over the first to third pixels PXL1, PXL2, and PXL3. The color filter layer CFL may include color filters CF1, CF2, and CF3, a planarization layer PLA, and an overcoat layer OC.

In one or more embodiments, the color filters CF1, CF2, and CF3 may be disposed on the second capping layer CAP2. In a plan view, the color filters CF1, CF2, and CF3 may respectively overlap the emission areas EMA of the first to third pixels PXL1, PXL2, and PXL3.

In one or more embodiments, the first color filter CF1 may allow a first color of light to pass therethrough and prevent a second color of light and a third color of light from passing therethrough. For example, the first color filter CF1 may include colorant for the first color.

In one or more embodiments, the second color filter CF2 may allow the second color of light to pass therethrough and prevent the first color of light and the third color of light from passing therethrough. For example, the second color filter CF2 may include colorant for the second color.

In one or more embodiments, the third color filter CF3 may allow the third color of light to pass therethrough and prevent the first color of light and the second color of light from passing therethrough. For example, the third color filter CF3 may include colorant for the third color.

In one or more embodiments, the planarization layer PLA may be disposed on the color filters CF1, CF2, and CF3. The planarization layer PLA may cover the color filters CF1, CF2, and CF3. The planarization layer PLA may offset a step difference caused by the color filters CF1, CF2, and CF3. The planarization layer PLA may be provided over the first to third pixels PXL1, PXL2, and PXL3.

For instance, the planarization layer PLA may include organic material such as acrylates resin, epoxy resin, phenolic resin, polyamides resin, polyimides resin, polyesters resin, polyphenylene sulfides resin, or benzocyclobutene (BCB). However, the present disclosure is not limited thereto. The planarization layer PLA may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The overcoat layer OC may be disposed on the planarization layer PLA. The overcoat layer OC may be disposed between an upper film layer UFL and the color filter layer CFL. The overcoat layer OC may be provided over the first to third pixels PXL1, PXL2, and PXL3. The overcoat layer OC may cover a lower component including the color filter layer CFL. The overcoat layer OC may prevent water or air from permeating the lower component. Furthermore, the overcoat layer OC may protect the lower component from foreign material such as dust.

In one or more embodiments, the overcoat layer OC may include organic material such as acrylates resin, epoxy resin, phenolic resin, polyamides resin, polyimides resin, polyesters resin, polyphenylene sulfides resin, or benzocyclobutene (BCB). However, the present disclosure is not limited thereto. The overcoat layer OC may include various inorganic materials including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The upper film layer UFL may be disposed on the color filter layer CFL. The upper film layer UFL may be disposed in an outer portion of the display device DD to reduce external influence on the display device DD. The upper film layer UFL may be provided over the first to third pixels PXL1, PXL2, and PXL3.

In one or more embodiments, the upper film layer UFL may include an anti-reflective (AR) coating layer. The AR coating layer may refer to a component formed by applying material having an anti-reflective function to a surface of a specific component. Here, the material to be applied may have a low reflectivity. For example, the material that is used for the AR coating layer may include any one of $SiO_x$, $ZiO_x$, $Al_xO_y$, and $TiO_x$. However, the present disclosure is not limited thereto, and various known materials may be used.

Although in FIG. 17 there has been described that the color conversion layer CCL is disposed on the same layer as that of the display element layer DPL, the present disclosure is not limited thereto.

Referring to FIG. 18, the color conversion layer CCL may be disposed on the display element layer DPL. For example, the first capping layer CAP1 may seal (or cover) the area in which the light emitting elements LD are disposed. The color conversion layer CCL may be disposed on the first capping layer CAP1.

In the present embodiment, the color conversion layer CCL may further include a light block layer LBL. The light block layer LBL may be disposed on the display element layer DPL. The light block layer LBL may be disposed between the first capping layer CAP1 and the second capping layer CAP2. The light block layer LBL may be disposed in boundaries between the first to third pixels PXL1, PXL2, and PXL3 to enclose the first wavelength conversion pattern WCP1, the second wavelength conversion pattern WCP2, and the light transmission pattern LTP.

The light block layer LBL may define the emission area EMA and the non-emission area NEA of the pixel PXL. For example, the light block layer LBL may not overlap the emission area EMA, in a plan view. The light block layer LBL may overlap the non-emission area NEA, in a plan view. In one or more embodiments, areas in which the light block layer LBL is not disposed may be defined as the emission areas EMA of the first to third pixels PXL1, PXL2, and PXL3.

In one or more embodiments, the light block layer LBL may be formed of organic material including at least one of graphite, carbon block, black pigment, and black dye, or formed of metal including chrome (Cr). The material of the light block layer LBL is not limited so long as the material can prevent light transmission and absorb light.

The second capping layer CAP2 may seal (or cover) the first wavelength conversion pattern WCP1, the second wavelength conversion pattern WCP2, and the light transmission pattern LTP.

The low refractive layer LRL may be disposed between the second capping layer CAP2 and a third capping layer CAP3. The third capping layer CAP3 may be formed of a single layer or multiple layers including at least one insulating material from among silicon oxide ($SiO_x$), silicon nitride ($SiN_x$), silicon oxynitride ($SiO_xN_y$), aluminum oxide ($AlO_x$), and titanium dioxide ($TiO_x$), in the same manner as that of the first capping layer CAP1 and the second capping layer CAP2, but the present disclosure is not limited thereto.

FIGS. 19A to 19F are sectional views schematically illustrating a method of fabricating the display device in accordance with one or more embodiments. FIGS. 19A to 19F illustrate sectional views corresponding to FIG. 9. For the sake of explanation, components (i.e., the pixel circuit layer PCL and the substrate SUB) provided under the passivation layer PSV are omitted.

Figure 19A:
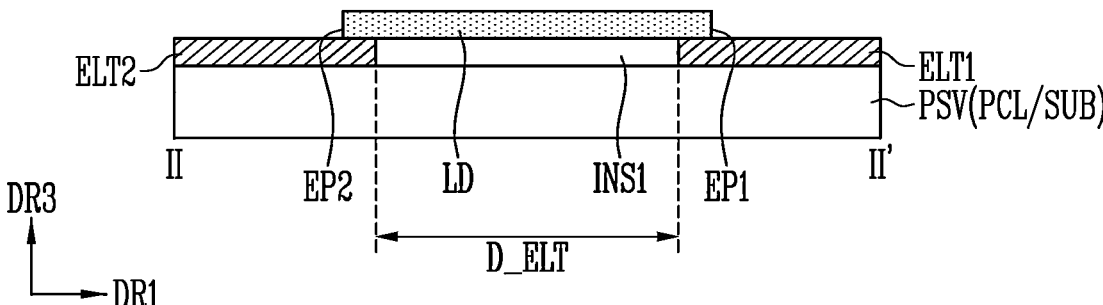
FIGS. 19A to 19F are sectional views schematically illustrating a method of fabricating the display device in accordance with one or more embodiments.

Referring to FIGS. 8, 9, and 19A, a panel including the first electrode ELT1, the second electrode ELT2, and the light emitting element LD that are disposed on the passivation layer PSV (or the substrate SUB) may be prepared.

The first electrode ELT1 and the second electrode ELT2 that are spaced from each other in the first direction DR1 may be disposed on the passivation layer PSV (or the substrate SUB). The first insulating layer INS1 may be disposed between the first electrode ELT1 and the second electrode ELT2. The light emitting element LD may be disposed or aligned on the first electrode ELT1 and the second electrode ELT2 (and the first insulating layer INS1).

Figure 19B:
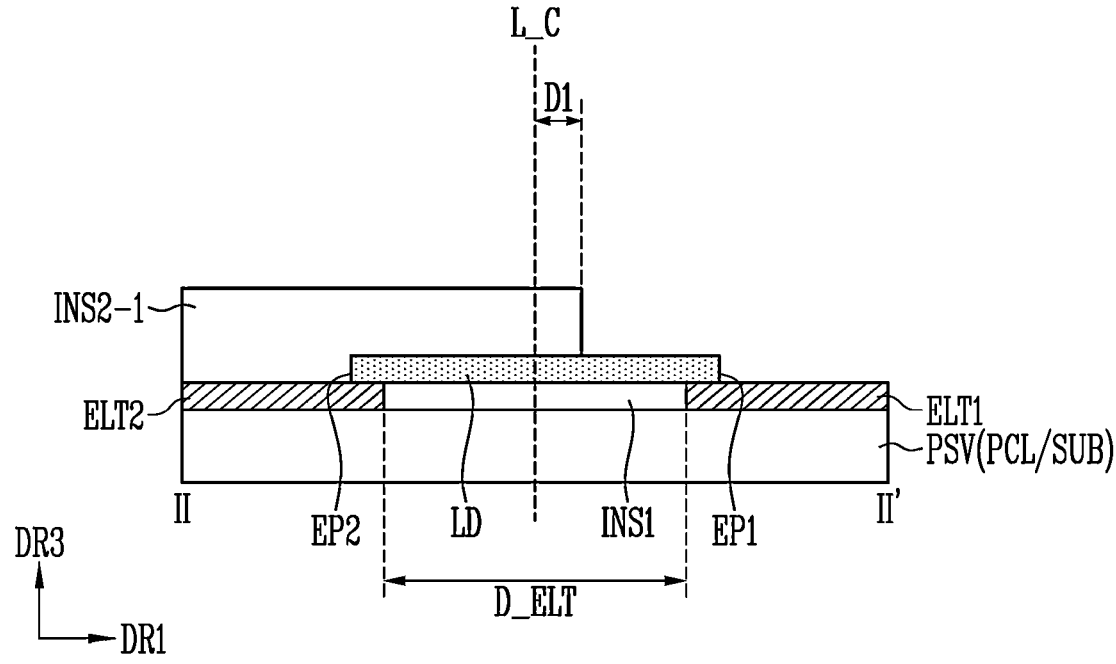

Thereafter, as illustrated in FIG. 19B, the first insulating pattern INS2-1 may be formed on the light emitting element LD and the second electrode ELT2. The first insulating pattern INS2-1 may cover the second end EP2 of the light emitting element LD and the second electrode ELT2, and allow the first end EP1 of the light emitting element LD to be exposed.

In one or more embodiments, the first end of the first insulating pattern INS2-1 (i.e., the end of the first insulating pattern INS2-1 that faces (or opposes) the first electrode ELT1) may protrude or extend from a reference line L_C (or a reference plane) by a first distance D1 in the first direction DR1. The reference line L_C may cross a central portion (or a central point) between the first electrode ELT1 and the second electrode ELT2. For example, a distance D_ELT between the first electrode ELT1 and the second electrode ELT2 may be approximately 3.5 μm, and the first distance D1 may be approximately 0.5 μm.

Figure 19C:
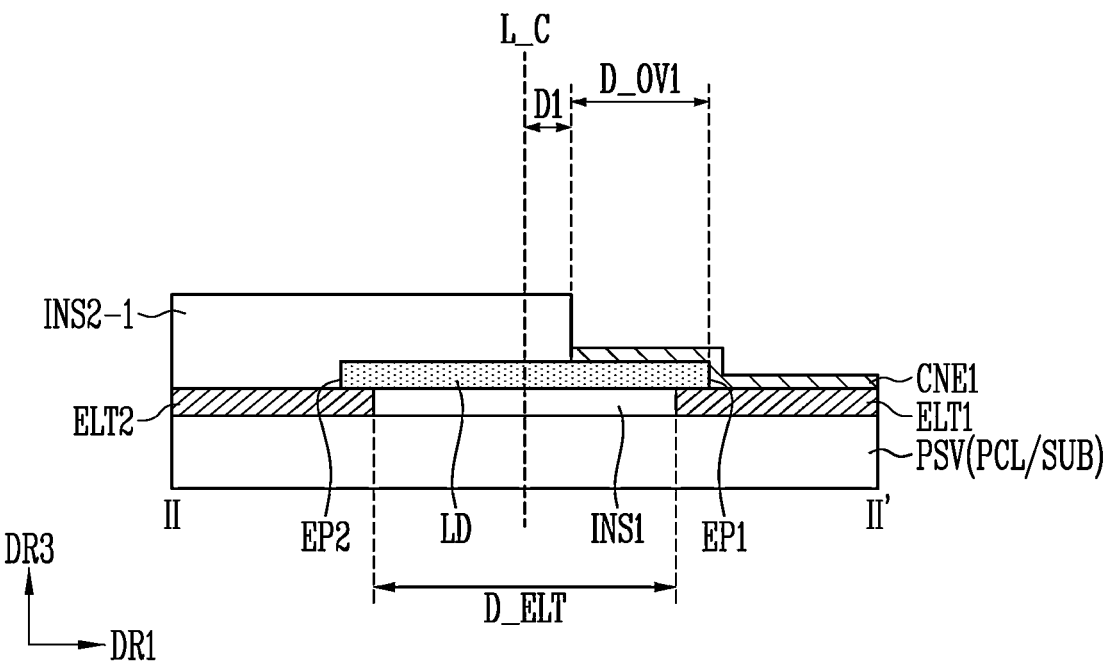

Subsequently, as illustrated in FIG. 19C, the first contact electrode CNE1 may be primarily formed on the first end EP1 of the light emitting element LD and the first electrode ELT1. To secure reliable contact (e.g., the first overlap distance D_OV1) between the first contact electrode CNE1 and the light emitting element LD, an end of the first contact electrode CNE1 may be disposed to contact or overlap the first insulating pattern INS2-1. For example, the first overlap distance D_OV1 may be approximately 1.5 μm.

Figure 19D:
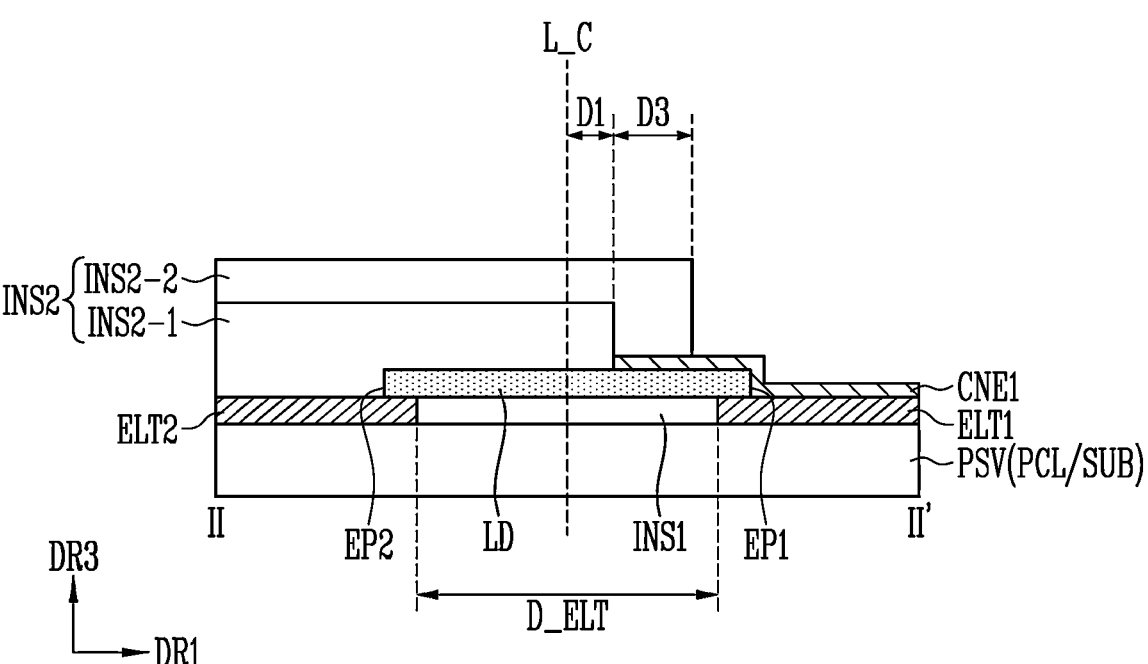

Thereafter, as illustrated in FIG. 19D, the second insulating pattern INS2-2 may be formed on the first insulating pattern INS2-1. The first end of the second insulating pattern INS2-2 may protrude in the first direction DR1 by a third distance D3 compared to the first end of the first insulating pattern INS2-1. The second insulating pattern INS2-2 may be formed on a portion of the first contact electrode CNE1. For example, the third distance D3 may be approximately 1 μm, and the width of the second insulating pattern INS2-2 with respect to the first direction DR1 may be approximately 2 μm. The first insulating pattern INS2-1 and the second insulating pattern INS2-2 may form the second insulating layer INS2.

Figure 19E:
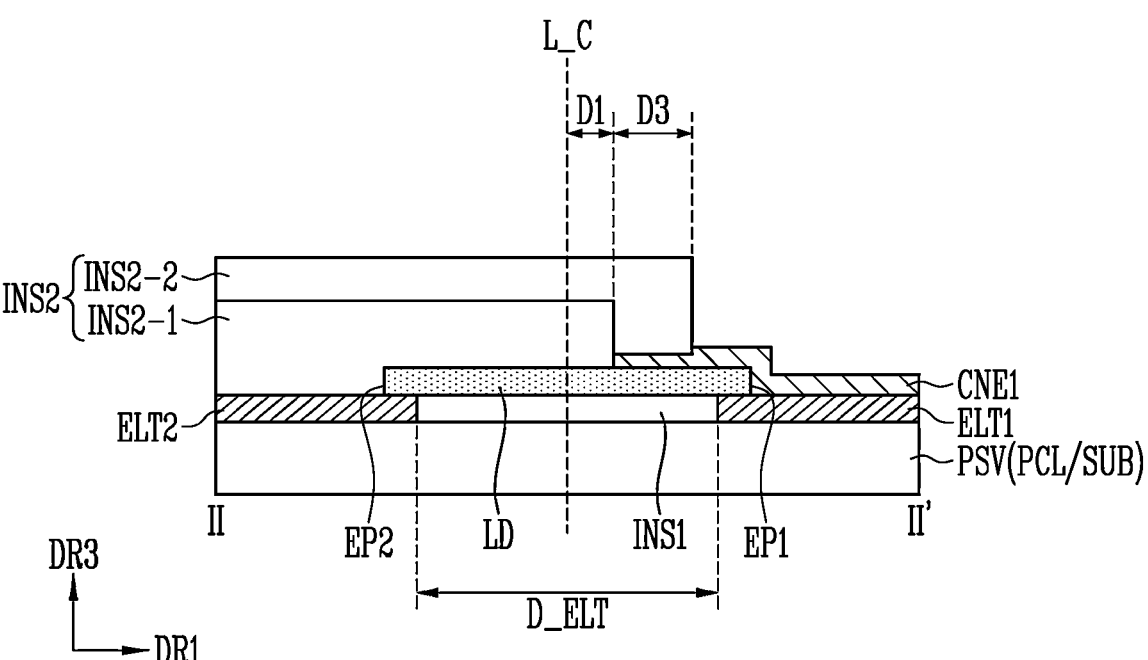

Subsequently, as illustrated in FIG. 19E, the first contact electrode CNE1 may be secondarily formed on the first end EP1 of the light emitting element LD and the first electrode ELT1. Hence, the thickness of the portion of the first contact electrode CNE1 that is exposed from the second insulating pattern INS2-2 may be increased, the stepped portion may be formed in the first contact electrode CNE1.

Depending on embodiments, a process of secondarily forming the first contact electrode CNE1 may be omitted.

Figure 19F:
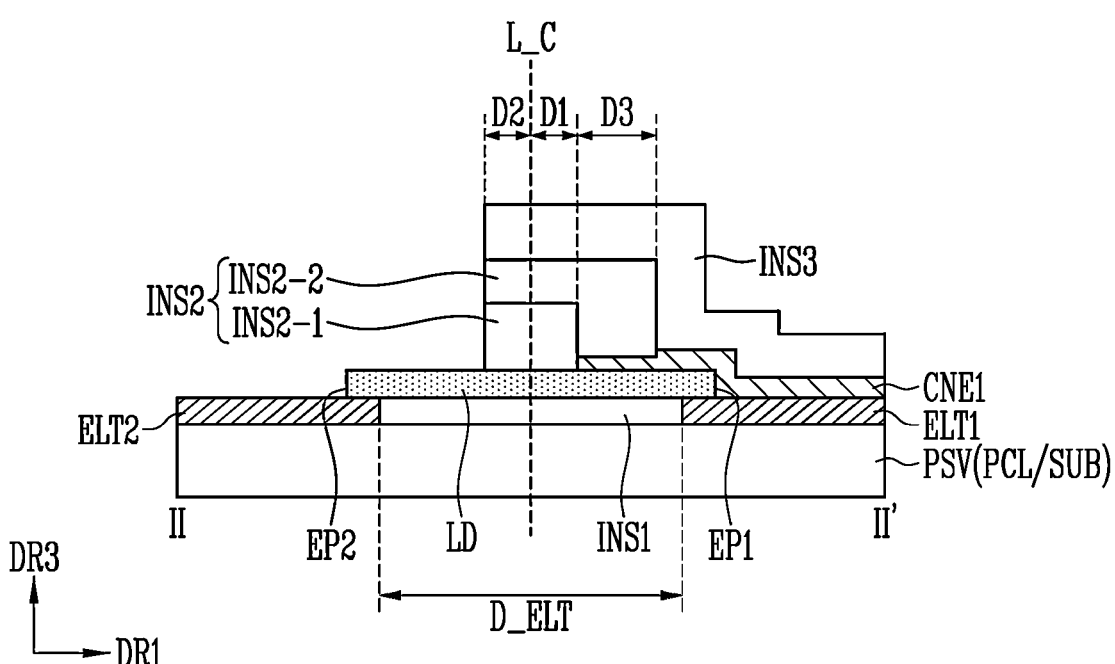

Thereafter, as illustrated in FIG. 19F, the third insulating layer INS3 may be formed to cover the second insulating pattern INS2-2 (or the second insulating layer INS2) and the first contact electrode CNE1. Furthermore, the second end EP2 of the light emitting element LD may be exposed by collectively etching the first insulating pattern INS2-1, the second insulating pattern INS2-2, and the third insulating layer INS3. As illustrated in FIG. 19F, on the light emitting element LD, an end of the third insulating layer INS3 (e.g., an end of the third insulating layer INS3 that faces (or opposes) the second electrode ELT2) may be aligned (e.g., coplanar) with the second end of the first insulating pattern INS2-1 and the second end of the second insulating pattern INS2-2. For example, depending on an etch time and an etch rate (i.e., an etch rate of the first insulating pattern INS2-1, an etch rate of the second insulating pattern INS2-2, and an etch rate of the third insulating layer INS3), as illustrated in FIG. 10, the end of the third insulating layer INS3, the second end of the first insulating pattern INS2-1, and the second end of the second insulating pattern INS2-2 may not be aligned with each other.

Thereafter, the second contact electrode CNE2 (refer to FIG. 9) is formed on the second end EP2 of the light emitting element LD and the second electrode ELT2, so that the pixel PXL of FIG. 9 (or a display panel or a display device including the pixel PXL) may be fabricated.

As described above, because the first insulating pattern INS2-1 is formed relatively adjacent to the reference line L_C, a sufficient overlap surface area of the first contact electrode CNE1 (and the second contact electrode CNE2) may be secured.

Furthermore, after the first contact electrode CNE1 is primarily formed, the second insulating pattern INS2-2 is formed to be biased in the second direction DR2 based on the reference line L_C. Hence, the first contact electrode CNE1 and the second contact electrode CNE2 may be spaced from each other by a sufficient distance, and a short circuit between the first contact electrode CNE1 and the second contact electrode CNE2 may be prevented from being caused.

Moreover, because the first contact electrode CNE1 is formed through total two processes (i.e., through a double deposition process) before and after the second insulating pattern INS2-2 is formed, contact between the light emitting element LD and the first contact electrode CNE1 may be further improved.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure may be defined by the accompanying claims and their equivalents.

What is claimed is:

1. A display device comprising:
   a first electrode and a second electrode spaced from each other on a substrate;
   a light emitting element on the first electrode and the second electrode;
   a first insulating pattern on the light emitting element;
   a first contact electrode adjacent to a first side of the first insulating pattern and contacting a first end of the light emitting element;
   a second insulating pattern on the first insulating pattern and partially covering the first contact electrode;
   a third insulating layer on the second insulating pattern; and
   a second contact electrode adjacent to a second side of the first insulating pattern, and contacting a second end of the light emitting element that is exposed from the first insulating pattern, the second insulating pattern, and the third insulating layer.

2. The display device according to claim 1, wherein a stepped portion is formed in a portion of the first contact electrode that is covered with the second insulating pattern.

3. The display device according to claim 2, wherein a thickness of the portion of the first contact electrode is less than an average thickness of the first contact electrode.

4. The display device according to claim 3, wherein the average thickness of the first contact electrode is greater than an average thickness of the second contact electrode.

5. The display device according to claim 1, wherein the first insulating pattern and the second insulating pattern comprise an identical material or similar materials.

6. The display device according to claim 1, wherein the second insulating pattern is on the light emitting element at a position closer to the first electrode than to the second electrode.

7. The display device according to claim 1, wherein the first electrode and the second electrode are spaced from each other in a first direction, and
   wherein a distance between the first contact electrode and the second contact electrode in the first direction is equal to or less than one third of a distance between the first electrode and the second electrode in the first direction.

8. The display device according to claim 7, wherein the distance between the first contact electrode and the second contact electrode is approximately 1 μm.

9. The display device according to claim 8, wherein a width of the second insulating pattern with respect to the first direction is approximately 2 μm.

10. The display device according to claim 1, wherein the second contact electrode partially covers the third insulating layer.

11. The display device according to claim 10, wherein the first contact electrode partially covers the first insulating pattern.

12. The display device according to claim 11, wherein the first contact electrode comprises:
   a first part located between the first insulating pattern and the second insulating pattern; and
   a second part located between the second insulating pattern and the third insulating layer.

13. The display device according to claim 1, wherein an average thickness of the first contact electrode is substantially identical with an average thickness of the second contact electrode.

14. The display device according to claim 1, further comprising color conversion particles on the light emitting element, and configured to convert light having a first color emitted from the light emitting element to light having a second color.

15. A display device comprising:
   a first electrode and a second electrode spaced from each other on a substrate;
   a light emitting element on the first electrode and the second electrode;
   an insulating pattern on the light emitting element;
   a first contact electrode adjacent to a first side of the insulating pattern and contacting a first end of the light emitting element; and
   a second contact electrode adjacent to a second side of the insulating pattern and contacting a second end of the light emitting element,
   wherein a stepped portion is formed in a portion of the first contact electrode that overlaps the insulating pattern in a thickness direction of the substrate, and wherein a thickness of the portion of the first contact electrode is less than an average thickness of the first contact electrode.

16. The display device according to claim 15, wherein the portion of the first contact electrode is located between the insulating pattern and the light emitting element.

17. The display device according to claim 15, wherein the insulating pattern is on the light emitting element at a position closer to the first electrode than to the second electrode.

18. The display device according to claim 15, wherein the first electrode and the second electrode touch the light emitting element.

19. A method of fabricating a display device, comprising:

preparing a panel comprising a first electrode and a second electrode spaced from each other on a substrate, and a light emitting element on the first electrode and the second electrode;

forming a first insulating pattern on the light emitting element, the first insulating pattern exposing a first end of the light emitting element, and covering a second end of the light emitting element;

forming a first contact electrode on the first end of the light emitting element and the first electrode;

forming a second insulating pattern on the first insulating pattern and a portion of the first contact electrode;

exposing the second end of the light emitting element by forming a third insulating layer that covers the second insulating pattern and the first contact electrode and by partially etching the first insulating pattern, the second insulating pattern, and the third insulating layer; and forming a second contact electrode on the second end of the light emitting element and the second electrode.

20. The method according to claim 19, further comprising forming the first contact electrode on the first end of the light emitting element and the first electrode after forming the second insulating pattern, wherein a stepped portion is formed in a portion of the first contact electrode that is covered with the second insulating pattern.

\* \* \* \* \*